US012342670B2

(12) United States Patent
Lee et al.

(10) Patent No.: US 12,342,670 B2
(45) Date of Patent: Jun. 24, 2025

(54) DISPLAY DEVICE AND METHOD OF MANUFACTURING THE SAME

(71) Applicant: Samsung Display Co., Ltd., Yongin-si (KR)

(72) Inventors: Hyun Wook Lee, Suwon-si (KR); Seung Min Lee, Hwaseong-si (KR); Tae Woo Kim, Seoul (KR); Kyung Tae Chae, Hwaseong-si (KR); Jung Eun Hong, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 590 days.

(21) Appl. No.: 17/644,763

(22) Filed: Dec. 16, 2021

(65) Prior Publication Data

US 2022/0199682 A1 Jun. 23, 2022

(30) Foreign Application Priority Data

Dec. 18, 2020 (KR) ........................ 10-2020-0178657

(51) Int. Cl.
*H10H 20/821* (2025.01)
*H10H 20/01* (2025.01)
(Continued)

(52) U.S. Cl.
CPC .......... *H10H 29/142* (2025.01); *H10H 20/01* (2025.01); *H10H 20/821* (2025.01); *H10H 20/84* (2025.01); *H10H 20/8515* (2025.01)

(58) Field of Classification Search
CPC . H01L 25/0753; H01L 25/167; H01L 27/156; H01L 2933/0091; H01L 33/005;
(Continued)

(56) References Cited

U.S. PATENT DOCUMENTS 10,622,432 B2  4/2020  Kim et al.
2013/0001564 A1*  1/2013  Choi ................. H10K 59/131
257/40
(Continued)

FOREIGN PATENT DOCUMENTS

KR  2018-0119192 A  11/2018
KR  2019-0030840 A  3/2019
(Continued)

OTHER PUBLICATIONS

International Search Report issued Mar. 30, 2022, in corresponding International Application No. PCT/ KR2021/019161 (4 pages).
(Continued)

*Primary Examiner* — Matthew C Landau
*Assistant Examiner* — Dmitriy Yemelyanov
(74) *Attorney, Agent, or Firm* — Womble Bond Dickinson (US) LLP

(57) ABSTRACT

Display device includes a first substrate; an active material layer on the first substrate and including a channel area, a first doped area on one side of the channel area, and a second doped area on another side of the channel area; a gate insulating layer on the active material layer; a first conductive layer on the gate insulating layer and including a gate electrode overlapping the channel area and a signal application electrode; a second conductive layer including a first electrode electrically connected to the first doped area, a second electrode electrically connected to the second doped area, and a third electrode electrically connected to the signal application electrode; a light emitting element; and a third conductive layer on the light emitting element, the third conductive layer including a first contact electrode electrically connected to the second electrode, and a second contact electrode electrically connected to the third electrode.

17 Claims, 18 Drawing Sheets

(51) Int. Cl.
*H10H 20/84* (2025.01)
*H10H 20/851* (2025.01)
*H10H 29/14* (2025.01)

(58) Field of Classification Search
CPC ....... H01L 33/24; H01L 33/44; H01L 33/501; H01L 33/507; H01L 33/62
See application file for complete search history.

(56) References Cited

U.S. PATENT DOCUMENTS

| | | | |
|---|---|---|---|
| 2014/0225071 A1* | 8/2014 | Park | H10K 59/131 |
| | | | 438/34 |
| 2018/0175009 A1* | 6/2018 | Kim | H01L 33/20 |
| 2019/0115513 A1* | 4/2019 | Im | H05K 1/111 |
| 2021/0351171 A1 | 11/2021 | Yoo et al. | |
| 2022/0077227 A1 | 3/2022 | Kang et al. | |
| 2022/0223575 A1 | 7/2022 | Kim et al. | |

FOREIGN PATENT DOCUMENTS

| | | |
|---|---|---|
| KR | 2020-0034904 A | 4/2020 |
| KR | 2020-0079379 A | 7/2020 |
| KR | 2020-0115868 A | 10/2020 |
| KR | 2020-0138479 A | 12/2020 |
| KR | 10-2021-0143969 A | 11/2021 |

OTHER PUBLICATIONS

Written Opinion issued Mar. 30, 2022, in corresponding International Application No. PCT/KR2021/019161 (4 pages).

* cited by examiner

LA: LA1, LA2, LA3

DISPLAY DEVICE AND METHOD OF MANUFACTURING THE SAME

CROSS-REFERENCE TO RELATED APPLICATION

This application claims priority to and the benefit of Korean Patent Application No. 10-2020-0178657 filed on Dec. 18, 2020 in the Korean Intellectual Property Office, the entire content of which is incorporated herein by reference.

BACKGROUND

1. Field

One or more embodiments of the present disclosure relate to a display device and a method of manufacturing the same.

2. Description of the Related Art

The importance of display devices is increasing with the development of multimedia. In response to this, various display devices such as organic light emitting diode (OLED) displays and/or liquid crystal displays (LCDs) are being used.

Devices for displaying images of display devices include display panels such as organic light emitting display panels and/or liquid crystal display panels. Among them, the light emitting display panel may include a light emitting element. For example, light emitting diodes (LEDs) include OLEDs using organic materials as fluorescent materials, inorganic LEDs using inorganic materials as fluorescent materials, and the like.

The inorganic LEDs using inorganic semiconductors as fluorescent materials advantageously have durability even in a high temperature environment and have high efficiency of blue light as compared to the OLEDs. Further, even in a manufacturing process pointed out as a limitation of the existing inorganic LED elements, a transfer method using a dielectrophoresis (DEP) method has been developed. Accordingly, research on the inorganic LEDs having excellent durability and efficiency as compared to the OLEDs is ongoing.

SUMMARY

One or more aspects of embodiments of the present disclosure provide a display device formed with a small number of masks.

One or more other aspects of embodiments of the present disclosure provide a method of manufacturing a display device, by which the display device is manufactured using a small number of masks.

The aspects of the present disclosure are not limited to the aspects described above, and those skilled in the art will clearly understand other technical aspects not described in the following description.

According to one or more embodiments, a display device comprises a first substrate including a display area and a non-display area around the display area; an active material layer on the first substrate and including a channel area, a first doped area on one side of the channel area, and a second doped area on another side of the channel area; a gate insulating layer on the active material layer; a first conductive layer on the gate insulating layer and including a gate electrode overlapping the channel area and a signal application electrode; an interlayer insulating layer on the first conductive layer; a via layer on the interlayer insulating layer; a second conductive layer on the via layer and including a first electrode electrically connected to the first doped area through a contact hole passing through the via layer and the interlayer insulating layer, a second electrode electrically connected to the second doped area through a contact hole passing through the via layer and the interlayer insulating layer, and a third electrode electrically connected to the signal application electrode through a contact hole passing through the via layer and the interlayer insulating layer; a first insulating layer on the second conductive layer; a light emitting element on the first insulating layer of the display area; and a third conductive layer on the light emitting element, the third conductive layer being connected to the light emitting element and including a first contact electrode electrically connected to the second electrode through a contact hole passing through the first insulating layer, and a second contact electrode electrically connected to the third electrode through a contact hole passing through the first insulating layer.

According to one or more embodiments, a display device comprises a first substrate; a first lower metal pattern and a second lower metal pattern on the first substrate; a buffer layer on the first lower metal pattern and the second lower metal pattern; an active material layer on the first substrate and including a channel area, a first doped area on one side of the channel area, and a second doped area on another side of the channel area; a gate insulating layer on the active material layer; a first conductive layer on the gate insulating layer and including a gate electrode overlapping the channel area; an interlayer insulating layer on the first conductive layer; a via layer on the interlayer insulating layer; a second conductive layer on the via layer and including a first electrode electrically connected to the first doped area through a contact hole passing through the via layer and the interlayer insulating layer and electrically connected to the first lower metal pattern through a contact hole passing through the via layer, the interlayer insulating layer, and the buffer layer, a second electrode electrically connected to the second doped area through a contact hole passing through the via layer and the interlayer insulating layer, and a third electrode electrically connected to the second lower metal pattern through a contact hole passing through the interlayer insulating layer and the buffer layer; a first insulating layer on the second conductive layer; a light emitting element on the first insulating layer; and a third conductive layer on the light emitting element and including a first contact electrode electrically connected to the second electrode through a contact hole passing through the first insulating layer, and a second contact electrode electrically connected to the third electrode through a contact hole passing through the first insulating layer.

According to one or more embodiments, a method of manufacturing a display device, the method comprises forming a lower metal layer on a first substrate and a buffer layer on the lower metal layer; forming an active material layer including a channel area on the buffer layer, a first doped area on one side of the channel area, and a second doped area on another side of the channel area; forming a first gate insulating layer and a second gate insulating layer on the active material layer; forming a gate electrode on the first gate insulating layer and forming a signal application electrode on the second gate insulating layer; forming an interlayer insulating layer on the gate electrode and the signal application electrode; forming a via layer on the interlayer insulating layer; forming a first contact hole, a second contact hole, a third contact hole, and a fourth contact holes passing through the via layer; extending the first contact hole to the lower metal layer and the active material layer, extending the second contact hole to the active material layer, extending the third contact hole to the active material layer, and extending the fourth contact hole to the signal application electrode; forming an electrode layer inside the first to fourth contact holes and on the via layer; forming a first electrode, a second electrode, and a third electrode by patterning the electrode layer; forming a first insulating layer on the first electrode, the second electrode, and the third electrode; forming inner banks and outer banks on the first insulating layer through a half-tone mask; forming a light emitting element on the first insulating layer by applying an alignment signal to the second electrode and the third electrode; forming a contact electrode layer on the light emitting element; forming a first organic pattern and a second organic pattern, which are separated from each other, on the contact electrode layer; and separating the contact electrode layer into a first contact electrode overlapping the first organic pattern and a second contact electrode overlapping the second organic pattern.

Descriptions of other embodiments are included in the detailed description and drawings.

BRIEF DESCRIPTION OF THE DRAWINGS

The above and other aspects and features of the present disclosure will become more apparent by describing embodiments thereof in more detail with reference to the attached drawings, in which.

DETAILED DESCRIPTION

Figure 1:
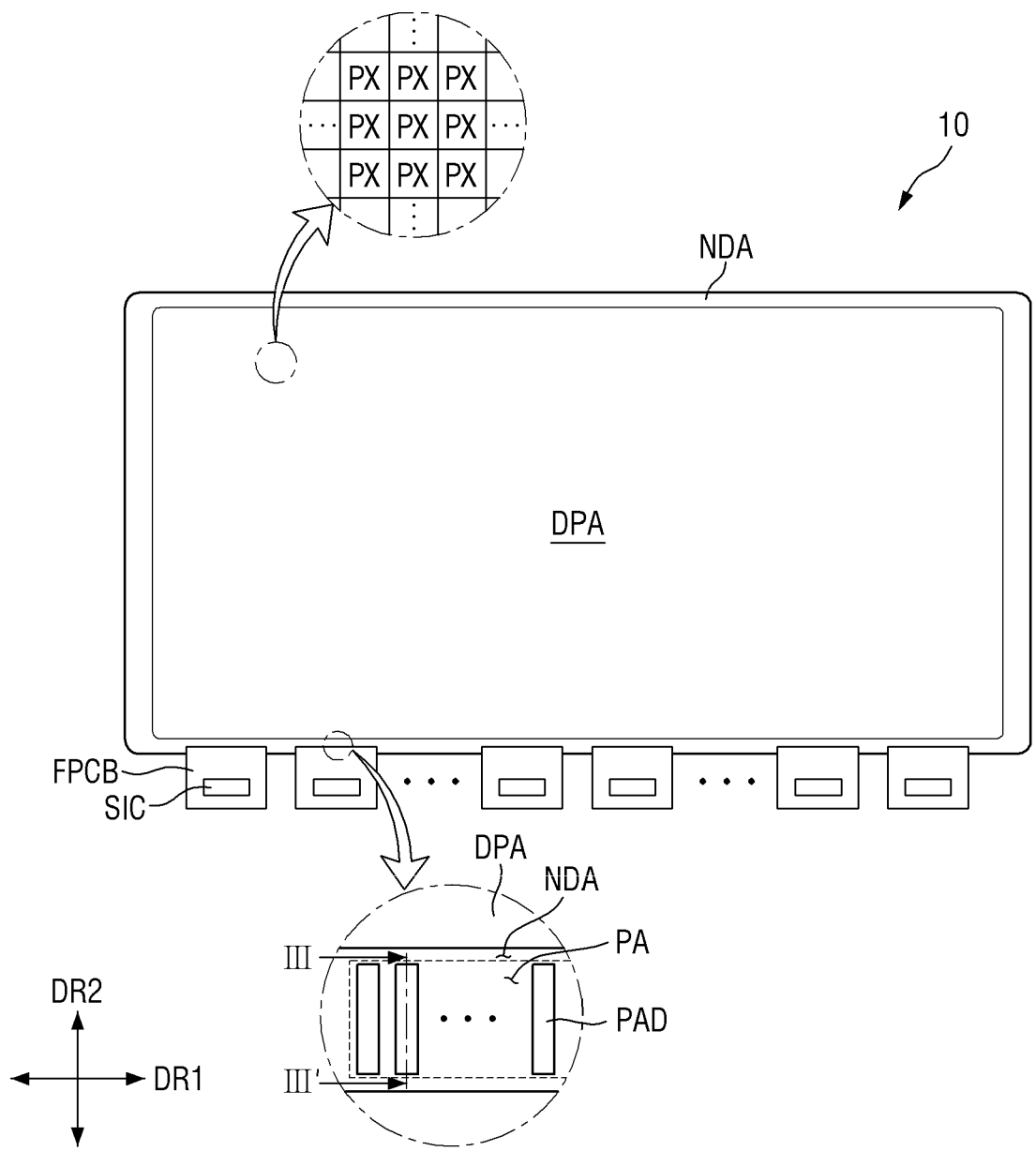
FIG. 1 is a plan view of a display device according to one or more embodiments.

Specific structural and functional descriptions of embodiments of the disclosure disclosed herein are only for illustrative purposes of the embodiments of the disclosure. The disclosure may be embodied in many different forms without departing from the spirit and significant characteristics of the disclosure. Therefore, the embodiments of the disclosure are disclosed only for illustrative purposes and should not be construed as limiting the disclosure. That is, the disclosure is only defined by the scope of the claims and their equivalents.

It will be understood that when an element is referred to as being related to another element such as being "coupled" or "connected" to another element, it can be directly coupled or connected to the other element or intervening elements may be present therebetween. In contrast, it should be understood that when an element is referred to as being related to another element such as being "directly coupled" or "directly connected" to another element, there are no intervening elements present. Other expressions that explain the relationship between elements, such as "between," "directly between," "adjacent to," or "directly adjacent to," should be construed in the same way.

Throughout the specification, the same reference numerals will refer to the same or like parts.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Further, the use of "may" when describing embodiments of the present disclosure refers to "one or more embodiments of the present disclosure".

Furthermore, relative terms, such as "lower" or "bottom" and "upper" or "top," may be used herein to describe one element's relationship to another element as illustrated in the drawings. It will be understood that relative terms are intended to encompass different orientations of the device in addition to the orientation depicted in the drawing. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described with reference to the attached drawings.

FIG. 1 is a plan view of a display device according to one or more embodiments.

Referring to FIG. 1, a display device 10 displays moving images and a still image. The display device 10 may refer to as any one of electronic devices providing a display screen. For example, a television, a laptop, a monitor, a billboard, an Internet of Things (IoT) device, a mobile phone, a smart phone, a tablet personal computer (PC), an electronic watch, a smart watch, a watch phone, a head mounted display, a mobile communication terminal, an electronic notebook, an electronic book, a portable multimedia player (PMP), a navigation device, a game console, a digital camera, a camcorder, and/or the like that provide a display screen may be provided as the display device 10.

The display device 10 includes a display panel providing a display screen. Examples of the display panel may include a light emitting diode (LED) display panel, an organic LED (OLED) panel, a quantum dot light emitting display panel, a plasma display panel, a field emission display panel, and the like. Hereinafter, a case in which the LED display panel is applied as an example of the display panel will be described, but the present disclosure is not limited thereto, and when the same technical spirit is applicable, the present disclosure may be applied to other suitable display panels.

The shape of the display device 10 may be variously suitably modified. For example, the display device 10 may have a shape such as a long horizontal rectangle, a long vertical rectangle, a square, a quadrangle having rounded corners (vertexes), other polygonal shapes, and/or a circle. The shape of a display area DPA of the display device 10 may also be similar to the overall shape of the display device 10. FIG. 1 illustrates the display device 10 and the display area DPA having a long horizontal rectangle shape.

The display device 10 may include the display area DPA and a non-display area NDA. The display area DPA is an area where a screen (e.g., an image) may be displayed and the non-display area NDA is an area where the screen (e.g., an image) is not displayed. The display area DPA may be referred to as an active area and the non-display area NDA may be referred to as an inactive area. The display area DPA may generally occupy the center of the display device 10.

The display area DPA may include a plurality of pixels PX. The plurality of pixels PX may be arranged in a matrix form. The shape of each pixel PX may be a rectangle or a square in a plan view, but the present disclosure is not limited thereto, and the shape of each pixel PX may be a rhombus shape in which each side is inclined in one direction. The pixels PX may be alternately arranged with each other in a stripe pattern or a PenTile®/PENTILE® pattern ((PENTILE® is a registered trademark owned by Samsung Display Co., Ltd.). Further, each of the pixels PX may include one or more light emitting elements configured to emit light in a set or specific wavelength band and may display a set or specific color.

The non-display area NDA may be around the display area DPA. The non-display area NDA may completely or partially surround the display area DPA. The display area DPA may have a rectangular shape, and the non-display area NDA may be adjacent to four sides of the display area DPA. The non-display area NDA may configure a bezel of the display device 10.

A flexible printed circuit board (FPCB) may be attached to the non-display area NDA. A plurality of FPCBs may be provided, and the plurality of FPCBs may be arranged in a first direction DR1. A driving integrated circuit SIC may be mounted on each FPCB. The driving integrated circuit SIC may be provided in the form of a driving chip.

In one or more embodiments, the non-display area NDA may further include a pad area PA in which a pad electrode PAD coupled to the FPCB is provided. A plurality of pad electrodes PAD may be provided and arranged in the first direction DR1.

Figure 2:
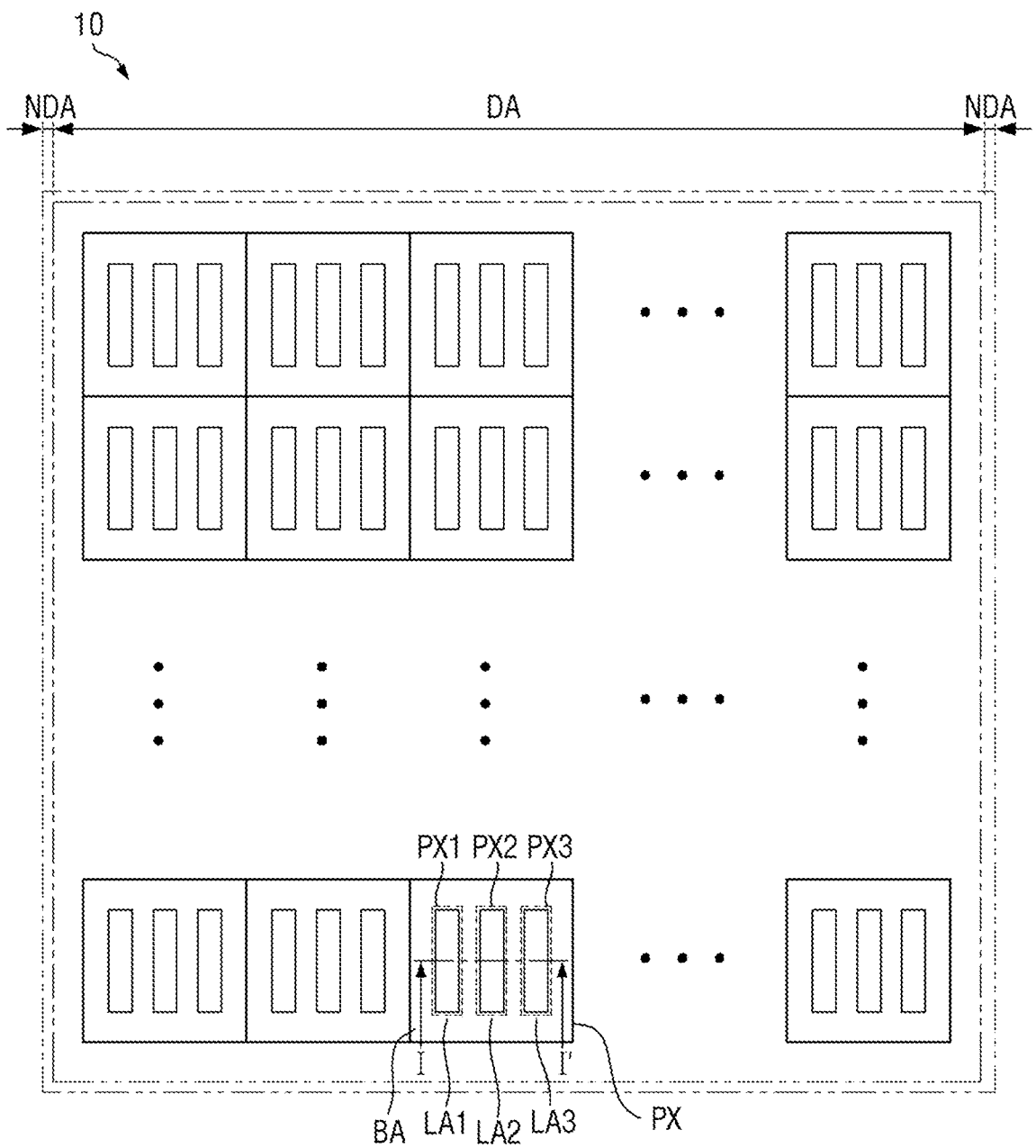
FIG. 2 is a plan view illustrating pixels of the display device according to the one or more embodiments.

FIG. 2 is a plan view illustrating pixels of the display device according to the embodiment.

Referring to FIG. 2, each of the plurality of pixels PX may include a first sub-pixel PX1, a second sub-pixel PX2, and a third sub-pixel PX3. The first sub-pixel PX1 may emit light having a first color, the second sub-pixel PX2 may emit light having a second color, and the third sub-pixel PX3 may emit light having a third color. The first color may be blue, the second color may be green, and the third color may be red.

However, the present disclosure is not limited thereto, and each of the sub-pixels PX1 to PX3 may emit light having the same color. Further, FIG. 2 illustrates that the pixel PX includes three sub-pixels, but the present disclosure is not limited thereto, and the pixel PX may include a larger number of sub-pixels.

Each of the sub-pixels PX1 to PX3 of the display device 10 may include an area defined as a light emitting area LA. The first sub-pixel PX1 may include a first light emitting area LA1, the second sub-pixel PX2 may include a second light emitting area LA2, and the third sub-pixel PX3 may include a third light emitting area LA3.

The light emitting area LA may be defined as an area in which a light emitting element 300 (see FIG. 3) included in the display device 10 is positioned and through which light in a set or specific wavelength band is emitted. The light emitting element may include an active layer 330 (see FIG. 7) and the active layer 330 may emit light in a set or specific wavelength band without directionality. The light emitted from the active layer 330 of the light emitting element 300 may be emitted in a lateral direction of the light emitting element 300 as well as in directions toward both ends of the light emitting element 300. The light emitting area LA may include an area where the light emitting element 300 is positioned and may include an area which is adjacent to the light emitting element 300 and through which the light emitted from the light emitting element 300 is emitted.

Further, the present disclosure is not limited thereto, and the light emitting area LA may include an area in which the light emitted from the light emitting element 300 is reflected or refracted by another member and is emitted. A plurality of light emitting elements 300 may be arranged in each of the sub-pixels PX1 to PX3, and the light emitting area LA including an area where the light emitting elements 300 are arranged and an area adjacent thereto may be formed.

In one or more embodiments, each of the sub-pixels PX1 to PX3 of the display device 10 may include a non-emission area BA defined as an area other than the light emitting area LA. The non-emission area BA may be an area in which the light emitting elements 300 are not arranged and through which the light is not emitted because the light emitted from the light emitting elements 300 does not reach the area.

Figure 3:
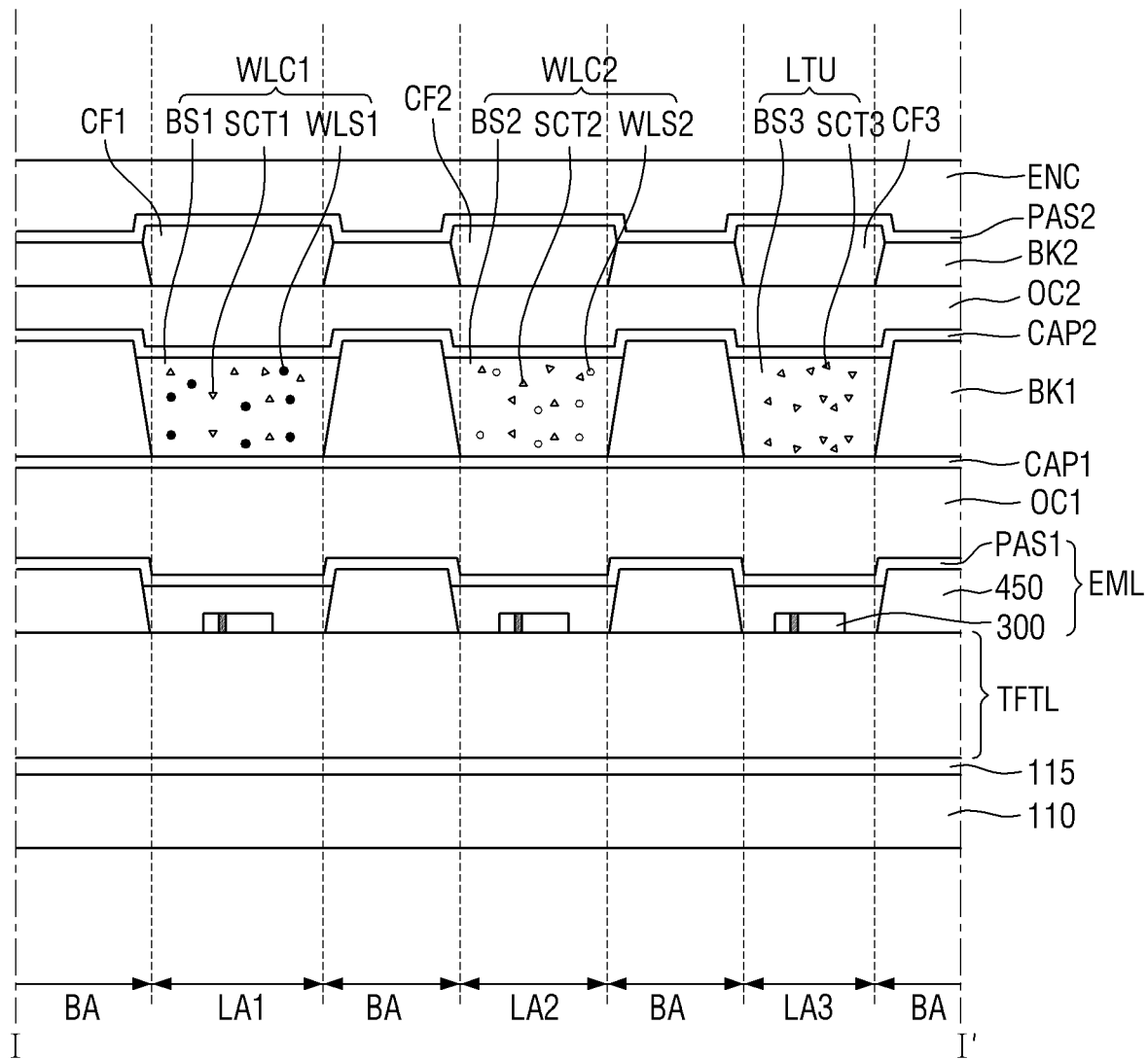
FIG. 3 is a cross-sectional view taken along line I-I' of FIG. 2.

FIG. 3 is a cross-sectional view taken along line I-I' of FIG. 2.

Referring to FIG. 3, the display device 10 of FIG. 1 may include a first substrate 110, a buffer layer 115, a thin film transistor layer TFTL, and a light emitting element layer EML.

The first substrate 110 may be a base substrate or a base member and may be made of an insulating material such as a polymer resin. For example, the first substrate 110 may be a rigid substrate.

The buffer layer 115 may be on the first substrate 110. The buffer layer 115 may made of an inorganic film that can prevent or reduce the penetration of air and/or moisture.

The thin film transistor layer TFTL may include a thin film transistor, a gate insulating layer, an interlayer insulating layer, and a via layer. The thin film transistor layer TFTL may be on the buffer layer 115 and may constitute a pixel circuit of each of the plurality of pixels.

The light emitting element layer EML may include the light emitting element 300, an anode electrode, a cathode electrode, an outer bank 450, and a first protective layer PAS1. The light emitting element 300 may be provided on the thin film transistor.

The display device 10 may further include a first planarization layer OC1, a first capping layer CAP1, a first bank BK1, a first wavelength conversion unit WLC1, a second wavelength conversion unit WLC2, a light transmission unit LTU, a second capping layer CAP2, a second planarization layer OC2, a second bank BK2, first to third color filters CF1, CF2, and CF3, a second protective layer PAS2, and an encapsulation layer ENC.

The first planarization layer OC1 may be provided on the light emitting element layer EML and may planarize an upper end of the light emitting element layer EML. The first planarization layer OC1 may include an organic material.

The first capping layer CAP1 may be on the first planarization layer OC1. The first capping layer CAP1 may seal the lower surfaces of the first and second wavelength conversion units WLC1 and WLC2 and the light transmission unit LTU. The first capping layer may include an inorganic material.

The first bank BK1 may be in a light blocking area BA on the first capping layer CAP1. The first bank BK1 may overlap the second bank BK2 in a thickness direction. The first bank BK1 may block or reduce light transmission.

The first bank BK1 may include an organic light blocking material and a liquid repellent component.

Because the first bank BK1 includes a light repellent component, the first and second wavelength conversion units WLC1 and WLC2 and the light transmission unit LTU may be separated to correspond to light emitting areas LA.

The first wavelength conversion unit WLC1 may be in the first light emitting area LA1 on the first capping layer CAP1. The first wavelength conversion unit WLC1 may be surrounded by the first bank BK1. The first wavelength conversion unit WLC1 may include a first base resin BS1, a first scattering body SCT1, and a first wavelength shifter WLS1.

The first base resin BS1 may include a material having relatively high light transmittance. The first base resin BS1 may be made of a transparent organic material. For example, the first base resin BS1 may include at least one of organic materials such as an epoxy-based resin, an acrylic-based resin, a cardo-based resin, or an imide-based resin.

The first scattering body SCT1 may have a refractive index different from that of the first base resin BS1 and may form an optical interface together with the first base resin BS1.

The first wavelength shifter WLS1 may convert or shift a peak wavelength of incident light to a first peak wavelength. For example, the first wavelength shifter WLS1 may convert blue light provided in the display device into red light having a single peak wavelength in the range of about 610 nm to about 650 nm and may emit the converted red light. The first wavelength shifter WLS1 may be a quantum dot, a quantum rod, or a phosphor. The quantum dot may be particulate matter that emits a set or specific color while electrons transition from a conduction band to a valence band.

The light emitted by the first wavelength shifter WLS1 may have a full width at half maximum (FWHM) of about 45 nm or less, about 40 nm or less, or about 30 nm or less, and may further improve the color purity and the color reproducibility of the color displayed by the display device.

A portion of the blue light provided by the light emitting element layer EML may pass through the first wavelength conversion unit WLC1 without being converted into the red light by the first wavelength shifter WLS1. Among the blue light provided by the light emitting element layer EML, light incident on the first color filter CF1 without being converted by the first wavelength conversion unit WLC1 may be blocked or reduced by the first color filter CF1. Further, the red light converted by the first wavelength conversion unit WLC1 among the blue light provided by the display device may pass through the first color filter CF1 and may be emitted to the outside. Thus, the first light emitting area LA1 may emit the red light.

The second wavelength conversion unit WLC2 may be in the second light emitting area LA2 on the first capping layer CAP1. The second wavelength conversion unit WLC2 may be surrounded by the first bank BK1. The second wavelength conversion unit WLC2 may include a second base resin BS2, a second scattering body SCT2, and a second wavelength shifter WLS2.

The second base resin BS2 may include a material having relatively high light transmittance. The second base resin BS2 may be made of a transparent organic material.

The second scattering body SCT2 may have a refractive index different from that of the second base resin BS2 and may form an optical interface together with the second base resin BS2. For example, the second scattering body SCT2 may include a light scattering material and/or light scattering particles that scatter at least a portion of transmitted light.

The second wavelength shifter WLS2 may convert or shift the peak wavelength of the incident light to a second peak wavelength different from the first peak wavelength of the first wavelength shifter WLS1. For example, the second wavelength shifter WLS2 may convert the blue light provided in the display device into green light having a single peak wavelength in the range of about 510 nm to about 550 nm and may emit the converted green light. The second wavelength shifter WLS2 may be a quantum dot, a quantum rod, or a phosphor. The second wavelength shifter WLS2 may include a material having the same purpose as the material illustrated in the first wavelength shifter WLS1.

The light transmission unit LTU may be in the third light emitting area LA3 on the first capping layer CAP1. The light transmission unit LTU may be surrounded by the first bank BK1. The light transmitting unit LTU may transmit the incident light while maintaining a peak wavelength. The light transmission unit LTU may include a third base resin BS3 and a third scattering body SCT3.

The third base resin BS3 may include a material having relatively high light transmittance. The third base resin BS3 may be made of a transparent organic material.

The third scattering body SCT3 may have a refractive index different from that of the third base resin BS3 and may form an optical interface together with the third base resin BS3. For example, the third scattering body SCT3 may include a light scattering material and/or light scattering particles that scatter at least a portion of the transmitted light.

The first and second wavelength conversion units WLC1 and WLC2 and the light transmission unit LTU are arranged on the light emitting element layer EML with the first planarization layer OC1 and the first capping layer CAP1 therebetween, and thus the display device does not require a separate substrate for the first and second wavelength conversion units WLC1 and WLC2 and the light transmission unit LTU.

The second capping layer CAP2 may cover the first and second wavelength conversion units WLC1 and WLC2, the light transmission unit LTU, and the first bank BK1.

The second planarization layer OC2 may be on the second capping layer CAP2 and may planarize upper ends of the first and second wavelength conversion units WLC1 and WLC2 and the light transmission unit LTU. The second planarization layer OC2 may include an organic material.

The second bank BK2 may be in a light blocking area BA on the second planarization layer OC2. The second bank BK2 may overlap the first bank BK1 in the thickness direction. The second bank BK2 may block or reduce light transmission.

The first color filter CF1 may be in the first light emitting area LA1 on the second planarization layer OC2. The first color filter CF1 may be surrounded by the second bank BK2. The first color filter CF1 may overlap the first wavelength conversion unit WLC1 in the thickness direction. The first color filter CF1 may selectively transmit light having a first color (for example, red light) and may block or absorb (or reduce) light having a second color (for example, green light) and light having a third color (for example, blue light).

The second color filter CF2 may be in the second light emitting area LA2 on the second planarization layer OC2. The second color filter CF2 may be surrounded by the second bank BK2. The second color filter CF2 may overlap the second wavelength conversion unit WLC2 in the thickness direction. The second color filter CF2 may selectively transmit the light having the second color (for example, green light) and may block or absorb (or reduce) the light having the first color (for example, red light) and the light having the third color (for example, blue light).

The third color filter CF3 may be in the third light emitting area LA3 on the second planarization layer OC2. The third color filter CF3 may be surrounded by the second bank BK2. The third color filter CF3 may overlap the light transmission unit LTU in the thickness direction. The third color filter CF3 may selectively transmit the light having the third color (for example, blue light) and may block or absorb (or reduce) the light having the first color (for example, red light) and the light having the second color (for example, green light).

The first to third color filters CF1, CF2, and CF3 may absorb a portion of light incident from the outside of the display device, thereby reducing reflected light caused by external light. Thus, the first to third color filters CF1, CF2, and CF3 may prevent or reduce color distortion due to the reflection of external light.

The second protective layer PAS2 may cover the first to third color filters CF1, CF2, and CF3. The second protective layer PAS2 may protect the first to third color filters CF1, CF2, and CF3.

The encapsulation layer ENC may be on the second protective layer PAS2. For example, the encapsulation layer ENC may include at least one inorganic film and may prevent or reduce the penetration of oxygen and/or moisture. Further, the encapsulation layer ENC may include at least one organic film and protect the display device from foreign matter such as dust.

Figure 4:
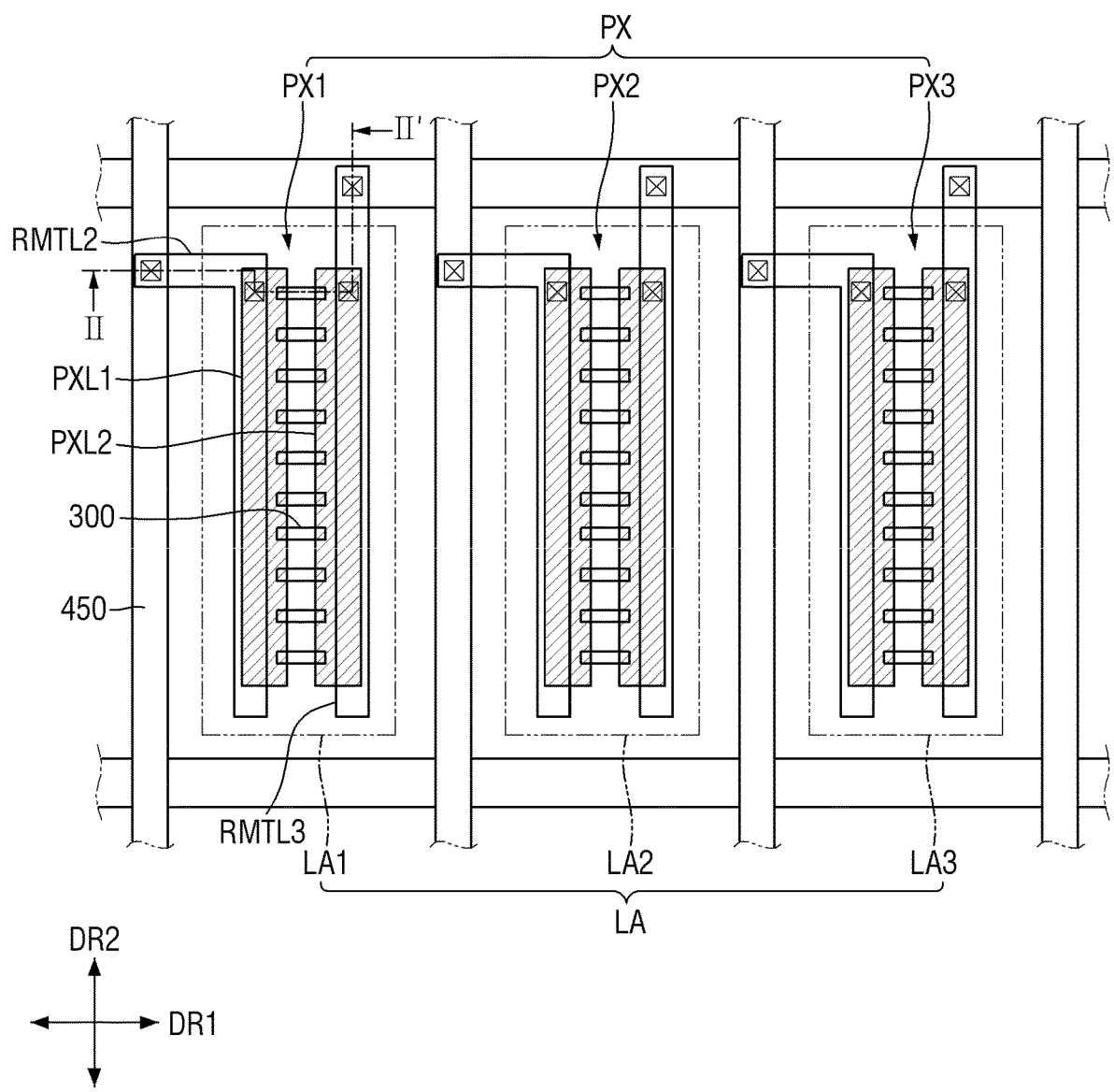
FIG. 4 is a schematic plan view illustrating one pixel of the display device according to the one or more embodiments.

FIG. 4 is a schematic plan view illustrating one pixel of the display device according to one or more embodiments.

Referring to FIG. 4, each of the sub-pixels PX1 to PX3 may further include a first contact electrode PXL1, a second contact electrode PXL2, a second electrode RMTL2, and a third electrode RMTL3. When description is made on the basis of the first sub-pixel PX1, the first contact electrode PXL1 may overlap and be in contact with one end (the other side in a first direction DR1) of the light emitting element 300, and the second contact electrode PXL2 may overlap and be in contact with the other end (one side in the first direction DR1) of the light emitting element 300.

The plurality of electrodes RMTL2 and RMTL3 may be electrically connected (e.g., electrically coupled) to the light emitting elements 300 and may receive a predetermined voltage so that the light emitting element 300 emits light. For example, the plurality of electrodes RMTL2 and RMTL3 may be electrically connected (e.g., electrically coupled) to the light emitting element 300 through the contact electrodes PXL1 and PXL2 and may transmit electrical signals applied to the electrodes RMTL2 and RMTL3 to the light emitting element 300 through the contact electrodes PXL1 and PXL2.

In one or more embodiments, the second electrode RMTL2 may be a pixel electrode separated for each sub-pixel, and the third electrode RMTL3 may be a common electrode commonly connected (e.g., commonly provided) along each sub-pixel. One of the second electrode RMTL2 and the third electrode RMTL3 may be an anode electrode of the light emitting element 300 and the other one thereof may be a cathode electrode of the light emitting element 300. However, the present disclosure is not limited thereto, and the opposite could be the case.

Figure 5:
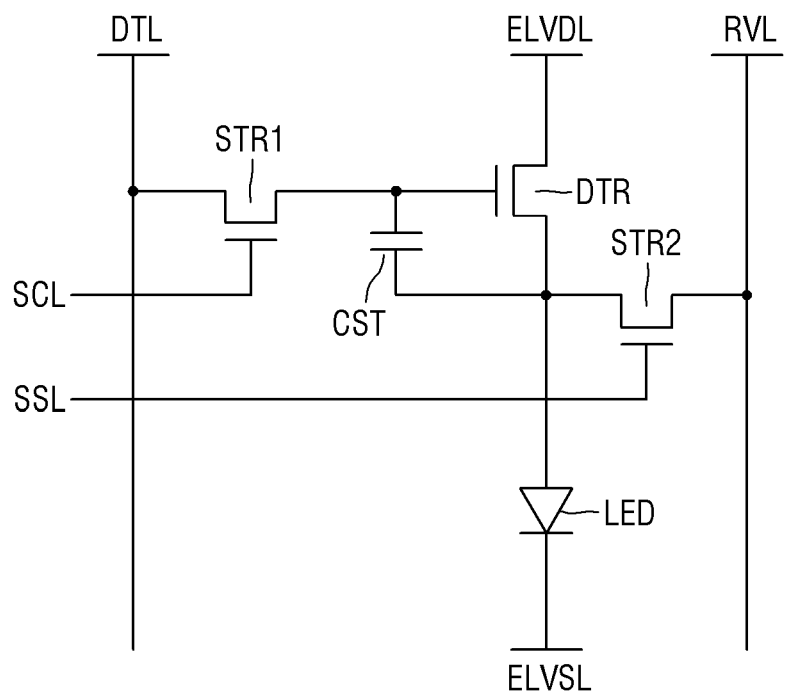
FIG. 5 is an equivalent circuit diagram of one sub-pixel of the display device according to the one or more embodiments.

FIG. 5 is an equivalent circuit diagram of one sub-pixel of the display device according to one or more embodiments.

Referring to FIG. 5, each sub-pixel of the display device according to one or more embodiments includes three transistors DTR, STR1, and STR2 and one storage capacitor CST, in addition to the light emitting element 300.

The light emitting element 300 emits light according to a current supplied through the drive transistor DTR. The light emitting element 300 may be implemented as an OLED, a micro LED, a nano LED, and/or the like.

The anode electrode of the light emitting element 300 may be connected (e.g., electrically coupled) to a source electrode (see FIG. 6) of the drive transistor DTR, and the cathode electrode may be connected (e.g., electrically coupled) to a second power line ELVSL (see also 123 and 123' in FIG. 6) to which a low potential voltage (second power voltage) lower than a high potential voltage (first power voltage) of a first power line ELVDL (see also RMTL1 in FIG. 6) is supplied.

The drive transistor DTR adjusts a current flowing from the first power line ELVDL to which the first power voltage is supplied to the light emitting element 300 according to a voltage difference between a gate electrode and the source electrode. The gate electrode of the drive transistor DTR may be connected (e.g., electrically coupled) to a first source/drain electrode of the first switching transistor STR1, the source electrode thereof may be connected (e.g., electrically coupled) to a first electrode of the light emitting element 300, and a drain electrode thereof may be connected (e.g., electrically coupled) to the first power line ELVDL to which the first power voltage is applied.

The first switching transistor STR1 is turned on by a scan signal of a scan line SCL to connect (e.g., electrically couple) a data line DTL to the gate electrode of the drive transistor DTR. A gate electrode of the first switching transistor STR1 may be connected to the scan line SCL, the first source/drain electrode thereof may be connected to the gate electrode of the drive transistor DTR, and a second source/drain electrode thereof may be connected to the data line DTL.

The second switching transistor STR2 is turned on by a sensing signal of a sensing signal line SSL to connect (e.g., electrically couple) a reference voltage line RVL to the source electrode of the drive transistor DTR. A gate electrode of the second switching transistor STR2 may be connected (e.g., electrically coupled) to the sensing signal line SSL, a first source/drain electrode thereof may be connected (e.g., electrically coupled) to the reference voltage line RVL, and a second source/drain electrode thereof may be connected (e.g., electrically coupled) to the source electrode of the drive transistor DTR.

In one or more embodiments, the first source/drain electrode of each of the first and second switching transistors STR1 and STR2 may be a source electrode and the second source/drain electrode thereof may be a drain electrode. However, the present disclosure is not limited thereto, and the opposite could be the case.

The capacitor CST is formed between the gate electrode and the source electrode of the drive transistor DTR. The storage capacitor CST stores a differential voltage between a gate voltage and a source voltage of the drive transistor DTR.

The drive transistor DTR and the first and second switching transistors STR1 and STR2 may be formed as thin film transistors. Further, in FIG. 3, the description is made based on the fact that the drive transistor DTR and the first and second switching transistors STR1 and STR2 are formed as an N-type metal oxide semiconductor field effect transistor (MOSFET), but the present disclosure is not limited thereto. For example, the drive transistor DTR and the first and second switching transistors STR1 and STR2 may be formed as a P-type MOSFET, or one thereof may be formed as the N-type MOSFET and the other may be formed as the P-type MOSFET.

Figure 6:
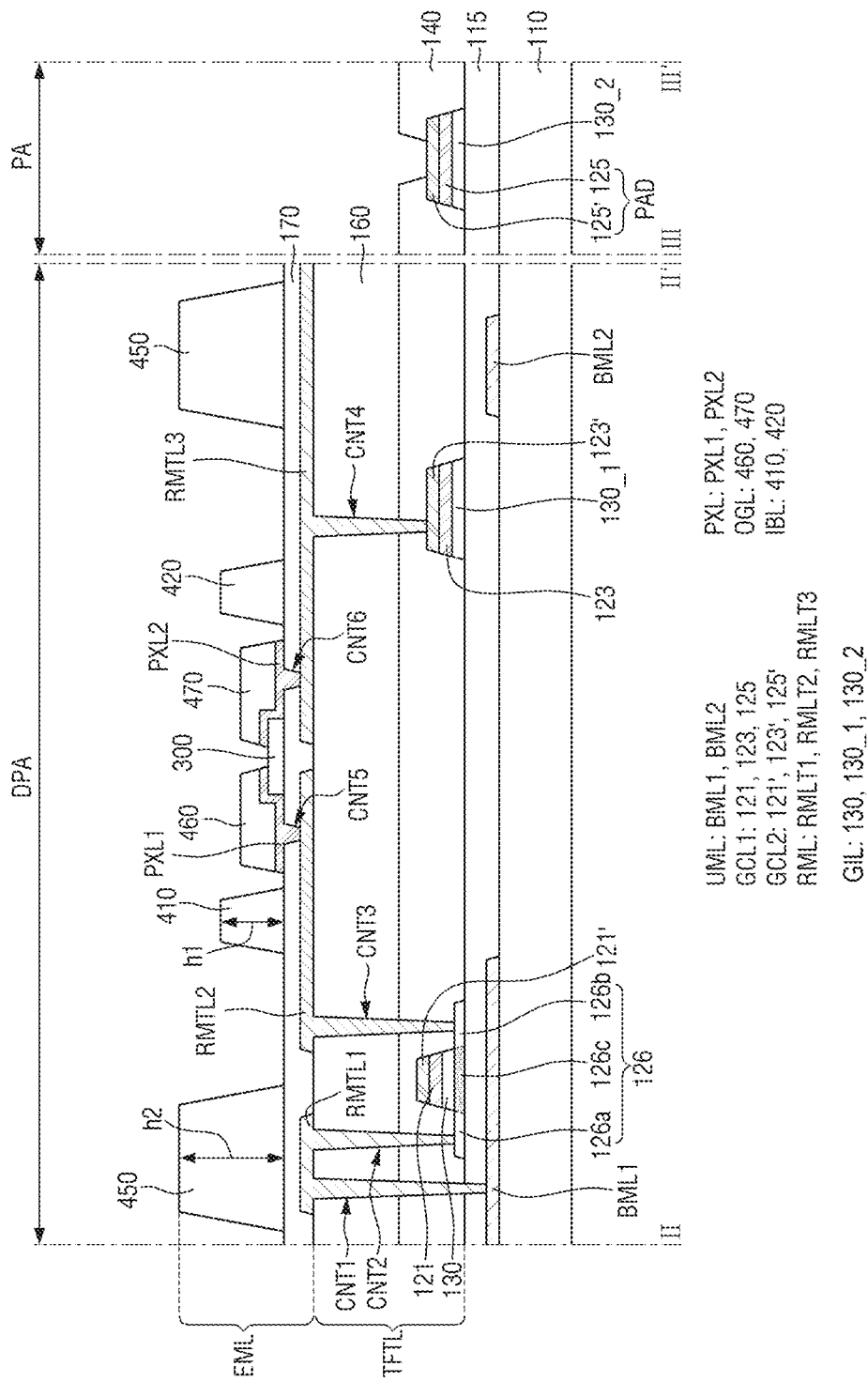
FIG. 6 is a cross-sectional view taken along line II-II' of FIG. 4 and line III-Ill' of FIG. 1.

FIG. 6 is a cross-sectional view taken along line II-II' of FIG. 4 and line III-III' of FIG. 1.

FIG. 6 illustrates only a cross section of the first sub-pixel PX1 of FIG. 4, but the same may be applied to other pixels or sub-pixels. FIG. 6 illustrates a cross section across one end and the other end of the light emitting element 300 in the first sub-pixel PX1 of FIG. 4. Further, FIG. 6 illustrates a cross section of the drive transistor DTR of FIG. 5.

Referring to FIG. 6, the display device 10 may further include a lower metal layer UML between the first substrate 110 and the buffer layer 115, an active material layer 126, a gate insulating layer GIL, a first gate conductive layer GCL1, a second gate conductive layer GCL2, an interlayer insulating layer 140, and a via layer 160 of the thin film transistor layer TFTL, and an electrode layer RML, a protective layer 170, a contact electrode layer PXL, an organic layer OGL, an inner bank layer IBL, and an outer bank 450 of the light emitting element layer EML.

The first substrate 110 may be an insulating substrate. The first substrate 110 may be made of an insulating material such as glass, quartz, and/or a polymer resin. Further, the first substrate 110 may be a rigid substrate, but may be a flexible substrate capable of bending, folding, rolling, and/or the like.

The lower metal layer UML may be on the first substrate 110. The lower metal layer UML may include a first lower metal pattern BML1 and a second lower metal pattern BML2. The first lower metal pattern BML1 may overlap the active material layer 126 of the drive transistor DTR in the thickness direction. The second lower metal pattern BML2 may overlap the third electrode RMTL3 in the thickness direction. The first lower metal pattern BML1 and the second lower metal pattern BML2 are located to be coplanar (e.g., may be on one plane).

The lower metal layer UML may include, for example, a light blocking material. The first lower metal pattern BML1 may prevent or reduce the penetration of light into the active material layer 126. As an example, the lower metal layer UML may be made of an opaque metal material that blocks or reduces light transmission. However, the lower metal layer UML is not limited to the light blocking function.

The first lower metal pattern BML1 may be electrically connected (e.g., electrically coupled) to the first electrode RMTL1 which will be further described below.

The buffer layer 115 may include the lower metal layer UML and may be entirely on the first substrate 110. The buffer layer 115 may be formed on the first substrate 110 to protect the active material layer 126 from moisture penetrating through the first substrate 110 which is vulnerable to moisture permeation, and may be formed through a chemical vapor deposition (CVD) method. The buffer layer 115 may be formed as a plurality of alternately stacked inorganic layers. For example, the buffer layer 115 may be formed as a multilayer in which one or more inorganic layers selected from a silicon oxide layer (SiOx), a silicon nitride layer (SiNx), and a silicon oxynitride layer (SiON) are laminated alternately with each other.

The active material layer 126 may partially overlap a gate electrode 121 of the first gate conductive layer GCL1.

In one or more embodiments, the active material layer 126 may include polycrystalline silicon, single crystalline silicon, an oxide semiconductor, and/or the like. The polycrystalline silicon may be formed by crystallizing amorphous silicon. Examples of the crystallization method may include a rapid thermal annealing (RTA) method, a solid phase crystallization (SPC) method, an excimer laser annealing (ELA) method, a metal induced crystallization (MILC) method, a sequential lateral solidification (SLS) method, and the like, but the present disclosure is not limited thereto.

For example, when the active material layer 126 includes polycrystalline silicon, the active material layer 126 may include a first doped area 126a, a second doped area 126b, and a channel area 126c. The channel area 126c may be between the first doped area 126a and the second doped area 126b. The first doped area 126a and the second doped area 126b may be areas in which some areas of the active material layer 126 are doped with impurities.

However, the active material layer 126 is not necessarily limited to the above. In one or more embodiments, the active material layer 126 may include an oxide semiconductor. In this case, the first doped area 126a may be a first conductive area, and the second doped area 126b may be a second conductive area. When the active material layer 126 includes the oxide semiconductor, the oxide semiconductor may be an oxide semiconductor containing indium (In). In some embodiments, the oxide semiconductor may be indium-tin oxide (ITO), indium-zinc oxide (IZO), indium-gallium oxide (IGO), indium-zinc-tin oxide (IZTO), indium-gallium-tin oxide (IGTO), indium-gallium-zinc-tin oxide (IGZTO), indium-gallium-zinc oxide (IGZO), and/or the like, but the present disclosure is not limited thereto.

The gate insulating layer GIL may be on the buffer layer 115 and the active material layer 126. The gate insulating layer GIL functions as a gate electrode insulating layer of the drive transistor DTR. The gate insulating layer GIL may be formed as a multilayer in which one or more inorganic layers selected from silicon oxide (SiOx), silicon nitride (SiNx), and silicon oxynitride (SiON) are laminated alternately with each other.

As illustrated in FIG. 6, the gate insulating layer GIL may include a plurality of patterns. The gate insulating layer GIL may include a first gate insulating pattern 130 overlapping the gate electrode 121 and the channel area 126c of the active material layer 126, a second gate insulating pattern 130_1 overlapping a signal application electrode 123, and a third gate insulating pattern 130_2 located in the pad area PA and overlapping a first pad part 125. The side surfaces of the gate electrode 121 and the first gate insulating pattern 130 overlapping the gate electrode 121 may be aligned, the side surfaces of the signal application electrode 123 and the second gate insulating pattern 130_1 overlapping the signal application electrode 123 may be aligned, and the side surfaces of the first pad part 125 and the third gate insulating pattern 130_2 overlapping the first pad part 125 may be aligned.

However, the present disclosure is not limited thereto, and in some embodiments, the gate insulating layer GIL may be completely (e.g., integrally) formed without including patterns.

The first gate conductive layer GCL1 is on the gate insulating layer GIL. The first gate conductive layer GCL1 may include the gate electrode 121, the signal application electrode 123, and the first pad part 125 located in the pad area PA. The gate electrode 121, the signal application electrode 123, and the first pad part 125 of the pad electrode PAD located in the pad area PA may be formed through the same process and made of the same material.

The gate electrode 121 may overlap at least a partial area of the active material layer 126. For example, the gate electrode 121 may overlap the channel area 126c of the active material layer 126 in the thickness direction. The gate electrode 121 may overlap the first gate insulating pattern 130, and the side surfaces of the gate electrode 121 may be aligned with the side surfaces of the first gate insulating pattern 130. The signal application electrode 123 may overlap the second gate insulating pattern 130_1, and the side surfaces of the signal application electrode 123 may be aligned with the side surfaces of the second gate insulating pattern 130_1. The first pad part 125 may overlap the third gate insulating pattern 130_2, and the side surfaces of the first pad part 125 may be aligned with the side surfaces of the third gate insulating pattern 130_2. The electrodes 121 and 123 and the pad part 125 of the first gate conductive layer GCL1 may be formed through the same mask as the first gate insulating pattern 130 of a lower gate insulating layer.

The first gate conductive layer GCL1 may be formed as a single layer or a multi-layer made of any one of molybdenum (Mo), aluminum (Al), chromium (Cr), gold (Au), titanium (Ti), nickel (Ni), neodymium (Nd), copper (Cu), or an alloy thereof. However, the present disclosure is not limited thereto.

The second gate conductive layer GCL2 may be on the first gate conductive layer GCL1. The second gate conductive layer GCL2 may include a sub gate electrode 121' overlapping the gate electrode 121 in the thickness direction, a sub signal application electrode 123' overlapping the signal application electrode 123 in the thickness direction, and a second pad part 125' overlapping the first pad part 125 in the thickness direction. The side surfaces of the sub gate electrode 121' may be aligned with the side surfaces of the gate electrode 121, the side surfaces of the sub signal application electrode 123' may be aligned with the side surfaces of the signal application electrode 123, and the side surfaces of the second pad part 125' may be aligned with the side surfaces of the first pad part 125. The electrodes 121' and 123' and the pad part 125' of the second gate conductive layer GCL2 may be formed through the same mask as the first gate conductive layer GCL1.

In particular, the first pad part 125 of the pad area PA may be vulnerable to corrosion due to outside air and/or moisture. Thus, in the related art, when a contact electrode layer PXL, which is in contact with a light emitting element and to which a transparent conductive material is applied, is formed, a capping conductive layer is also formed on the first pad part 125, and thus corrosion of the first pad part 125 is suppressed or reduced. However, when the cross-sectional structure of the display device in which the first pad part 125 is in the first gate conductive layer GCL1 is applied as in the embodiments, as illustrated in FIG. 6, a high level difference occurs in the interlayer insulating layer 140. When the contact electrode layer PXL is formed, and when the capping conductive layer needs to then be formed on the upper surface and the exposed side surfaces of the interlayer insulating layer 140 and the upper surface of the first pad part 125, it may not be easy to form the capping conductive layer on the exposed side surfaces of the interlayer insulating layer 140 due to the high level difference of the interlayer insulating layer 140.

According to one or more embodiments, when the second gate conductive layer GCL2 is formed after the first gate conductive layer GCL1 is formed, the second pad part 125' is immediately formed on the first pad part 125, and thus corrosion of the first pad part 125 is suppressed or reduced, while making the formation of the capping conductive layer easier.

The second gate conductive layer GCL2 may include a transparent conductive material. As an example, the second gate conductive layer GCL2 may include a material such as indium tin oxide (ITO), indium zinc oxide (IZO), and/or indium tin-zinc oxide (ITZO), but the present disclosure is not limited thereto. Corrosion of the electrodes 121' and 123' and the pad part 125' of the second gate conductive layer GCL2 may be prevented or reduced by capping the electrodes 121 and 123 and the pad part 125 of the first gate conductive layer GCL1 thereunder.

The interlayer insulating layer 140 is on the second gate conductive layer GCL2. The interlayer insulating layer 140 may function as an insulating film between the second gate conductive layer GCL2 and other layers arranged above the second gate conductive layer GCL2. The interlayer insulating layer 140 may be formed of an inorganic material, for example, silicon oxide (SiOx), silicon nitride (SiNx), or a stacked structure thereof.

The interlayer insulating layer 140 may partially expose the upper surface of the second pad part 125' in the pad area PA. In one or more embodiments, an electrode of the FPCB may be attached to the exposed upper surface of the second pad part 125'.

The via layer 160 may be on the interlayer insulating layer 140. The via layer 160 may include an organic insulating material and perform a surface planarization function. The via layer 160 may not be in the pad area PA.

The electrode layer RML may be on the via layer 160. The electrode layer RML may include a first electrode RMTL1, a second electrode RMTL2, and a third electrode RMTL3.

The first electrode RMTL1 may be electrically connected (e.g., electrically coupled) to the first doped area 126a of the active material layer 126 and the first lower metal pattern BML1. The first electrode RMTL1 may be electrically connected (e.g., electrically coupled) to the first lower metal pattern BML1 through a first contact hole CNT1 passing through the via layer 160, the interlayer insulating layer 140, and the buffer layer 115, and may be electrically connected (e.g., electrically coupled) to the first doped area 126a of the active material layer 126 through a second contact hole CNT2 passing through the via layer 160 and the interlayer insulating layer 140.

The second electrode RMTL2 may be electrically connected (e.g., electrically coupled) to the second doped area 126b of the active material layer 126. The second electrode RMTL2 may be electrically connected (e.g., electrically coupled) to the second doped area 126b of the active material layer 126 through a third contact hole CNT3 passing through the via layer 160 and the interlayer insulating layer 140.

The third electrode RMTL3 may be electrically connected (e.g., electrically coupled) to the sub signal application electrode 123' through a fourth contact hole CNT4 passing through the via layer 160 and the interlayer insulating layer 140.

Each of the second electrode RMTL2 and the third electrode RMTL3 may be used to form an electric field inside the sub pixel to align the light emitting elements 300. Furthermore, each of the second electrode RMTL2 and the third electrode RMTL3 may be electrically connected (e.g., electrically coupled) to the light emitting element 300.

In one or more embodiments, the first power voltage may be applied through the first lower metal pattern BML1, and the first power voltage applied through the first lower metal pattern BML1 may be applied to the second electrode RMTL2 through the first electrode RMTL1 and the active material layer 126. The second power voltage may be applied through the signal application electrode 123, and the second power voltage applied through the signal application electrode 123 may be applied to the third electrode RMTL3 through the sub signal application electrode 123'.

The first power voltage applied to the second electrode RMTL2 and the second power voltage applied to the third electrode RMTL3 may be used to align the light emitting elements 300 as described above. The light emitting elements 300 may be sprayed onto the second electrode RMTL2 and the third electrode RMTL3 in a state of being dispersed in a set or predetermined ink through an inkjet process and may be aligned between the second electrode RMTL2 and the third electrode RMTL3 through a method of applying a dielectrophoretic force to the light emitting element 300 by applying an alignment signal between the second electrode RMTL2 and the third electrode RMTL3.

Further, the first power voltage applied to the second electrode RMTL2 may be connected (e.g., applied) to one end of the light emitting element 300 through the first contact electrode PXL1 and the second power voltage applied to the third electrode RMTL3 may be connected (e.g., applied) to the other end of the light emitting element 300 through the second contact electrode PXL2 so as to drive the light emitting element 300. The second electrode RMTL2 may be an anode electrode, and the third electrode RMTL3 may be a cathode electrode.

The protective layer 170 may be on the electrode layer RML. The protective layer 170 may be formed of an inorganic material, for example, silicon oxide (SiOx), silicon nitride (SiNx), or a stacked structure thereof. The protective layer 170 serves to protect the electrode layer RML thereunder from outside air and/or moisture.

The contact electrode layer PXL may be on the protective layer 170. The contact electrode layer PXL may include the first contact electrode PXL1 connected (e.g., electrically coupled) to the second electrode RMTL2 through a fifth contact hole CNT5 passing through the protective layer 170 and a second contact electrode PXL2 connected (e.g., electrically coupled) to the third electrode RMTL3 through a sixth contact hole CNT6 passing through the protective layer 170. The first power voltage is applied to the first contact electrode PXL1 through the second electrode RMTL2, and the second power voltage is applied to the second contact electrode PXL2 through the third electrode RMTL3. The first contact electrode PXL1 may cover and be in direct contact with a side surface of one end and a portion of the upper surface of the light emitting element 300, and the second contact electrode PXL2 may cover and be in direct contact with a side surface of the other end and a portion of the upper surface of the light emitting element 300.

The first and second contact electrodes PXL1 and PXL2 may serve to suppress or reduce the movement of the light emitting element 300 by being in contact with the side surface and the portion of the upper surface of the light emitting element 300.

The first contact electrode PXL1 and the second contact electrode PXL2 may be arranged to be physically spaced apart from each other. The contact electrodes PXL1 and PXL2 may include a transparent conductive material. The contact electrodes PXL1 and PXL2 may include a material such as indium tin oxide (ITO), indium zinc oxide (IZO), and/or indium tin zinc oxide (ITZO), but embodiments of the present disclosure are not limited thereto. The organic layer OGL may be on the contact electrode layer PXL. The organic layer OGL may include a first organic pattern 460 overlapping the first contact electrode PXL1 and a second organic pattern 470 overlapping the second contact electrode PXL2. The first organic pattern 460 and the second organic pattern 470 may be arranged to be physically spaced apart from each other. The separation space between the first and second organic patterns 460 and 470 may overlap the separation space between the first and second contact electrodes PXL1 and PXL2 in the thickness direction.

The inner surface of the first organic pattern 460 may be aligned with the inner surface of the first contact electrode PXL1, and the inner surface of the second organic pattern 470 may be aligned with the inner surface of the second contact electrode PXL2. Although the outer surface of the first organic pattern 460 may be aligned with the outer surface of the first contact electrode PXL1, the present disclosure is not limited thereto. Likewise, although the outer surface of the second organic pattern 470 may be aligned with the outer surface of the second contact electrode PXL2, the present disclosure is not limited thereto.

In one or more embodiments, the inner bank layer IBL and the outer bank 450 may be arranged on the protective layer 170. The inner bank layer IBL is directly on the protective layer 170. The inner bank layer IBL may include a first inner bank 410 located on one side of the light emitting element 300 and a second inner bank 420 located on the other side of the light emitting element 300.

The first inner bank 410 and the second inner bank 420 may be arranged to be spaced apart from each other and to face each other. By arranging the inner banks 410 and 420 to be spaced apart from each other and to face each other, an area in which the light emitting element 300 is positioned may be formed therebetween.

Further, the first inner bank 410 and the second inner bank 420 may have a structure in which at least a portion thereof protrudes from the upper surface of the protective layer 170. The protruding parts of the first inner bank 410 and the second inner bank 420 may have inclined side surfaces. The inner banks 410 and 420 may provide the area in which the light emitting element 300 is positioned. In one or more embodiments, the inner banks 410 and 420 may include an organic insulating material such as polyimide (PI), but the present disclosure is not limited thereto.

The outer bank 450 may be located to be coplanar with the inner bank layer IBL. The outer bank 450 may be located outside the first inner bank 410 and outside the second inner bank 420.

The outer bank 450 may be formed through the same process as the inner bank layer IBL. The outer bank 450 and the inner bank layer IBL may be formed through the same mask process, and a height h2 of the outer bank 450 is larger than a height h1 of the inner banks 410 and 420. To this end, the outer bank 450 and the inner banks 410 and 420 having different heights may be formed using a half tone mask.

In one or more embodiments, the light emitting element 300 may be an LED, and for example, the light emitting element 300 may be an inorganic LED having a micrometer or nanometer unit size and made of an inorganic material. Inorganic LEDs may be arranged between two electrodes facing each other that form a polarity when an electric field is formed in a set or specific direction between the two electrodes. The light emitting elements 300 may be arranged between the electrodes by the electric field formed on the two electrodes.

The light emitting element 300 according to one or more embodiments may have a shape extending in one direction. The light emitting element 300 may have a shape such as a rod, a wire, and/or a tube. In one or more embodiments, the light emitting element 300 may have a cylindrical shape or a rod shape. However, the shape of the light emitting element 300 is not limited thereto, and the light emitting element 300 may have one of various suitable shapes including a shape of a polygonal column such as a regular hexahedron, a rectangular parallelepiped, and/or a hexagonal column, or a shape that extends in one direction but has a partially inclined outer surface. A plurality of semiconductors included in the light emitting element 300, which will be further described below, may have a structure in which the semiconductors are sequentially arranged or stacked in one direction.

The light emitting element 300 may include a semiconductor layer doped with a set or predetermined conductive type (for example, a p type or an n type) impurity. The semiconductor layer may receive an electrical signal applied from an external power source and emit the electrical signal as light in a set or specific wavelength band.

Figure 7:
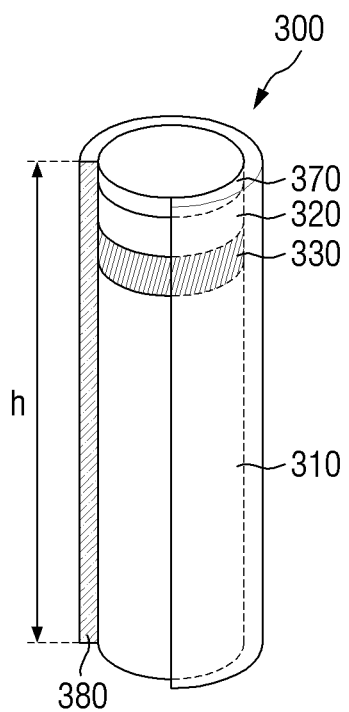
FIG. 7 is a schematic view of a light emitting element according to the one or more embodiments.

FIG. 7 is a schematic view of the light emitting element according to one or more embodiments.

Referring to FIG. 7, the light emitting element 300 may include a first semiconductor layer 310, a second semiconductor layer 320, an active layer 330, an electrode layer 370, and an insulating film 380.

The first semiconductor layer 310 may be an n-type semiconductor. As an example, when the light emitting element 300 emits light in the blue wavelength band, the first semiconductor layer 310 may include a semiconductor material having a chemical formula of $Al_xGa_yIn_{1-x-y}N$ ($0 \leq x \leq 1$, $0 \leq y \leq 1$, and $0 \leq x+y \leq 1$). For example, the semiconductor material may be one or more selected from n-type doped AlGaInN, GaN, AlGaN, InGaN, AlN, and InN. The first semiconductor layer 310 may be doped with an n-type dopant, and for example, the n-type dopant may be Si, Ge, Sn, and/or the like. In one or more embodiments, the first semiconductor layer 310 may be n-GaN doped with n-type Si. Although a length of the first semiconductor layer 310 may be in the range of about 1.5 μm to about 5 μm, the present disclosure is not limited thereto.

The second semiconductor layer 320 is on the active layer 330 which will be further described below. The second semiconductor layer 320 may be a p-type semiconductor, and as an example, when the light emitting element 300 emits light in the wavelength band of blue or green, the second semiconductor layer 320 may include a semiconductor material having a chemical formula of $Al_xGa_yIn_{1-x-y}N$ ($0 \leq x \leq 1$, $0 \leq y \leq 1$, and $0 \leq x+y \leq 1$). For example, the semiconductor material may be one or more of p-type doped AlGaInN, GaN, AlGaN, InGaN, AlN, and InN. The second semiconductor layer 320 may be doped with a p-type dopant, and for example, the p-type dopant may be Mg, Zn, Ca, Se, Ba, and/or the like. In one or more embodiments, the second semiconductor layer 320 may be p-GaN doped with p-type Mg. Although the length of the second semiconductor layer 320 may be in the range of about 0.05 μm to about 0.10 μm, the present disclosure is not limited thereto.

Although it is illustrated in the drawing that the first semiconductor layer 310 and the second semiconductor layer 320 are configured as one layer, the present disclosure is not limited thereto. In some embodiments, depending on the material of the active layer 330, the first semiconductor layer 310 and the second semiconductor layer 320 may further include a larger number of layers, for example, may include additional layers such as a clad layer and/or a tensile strain barrier reducing (TSBR) layer. The description thereof will be made below with reference to other drawings.

The active layer 330 is between the first semiconductor layer 310 and the second semiconductor layer 320. The active layer 330 may include a material having a single or multiple quantum well structure. When the active layer 330 includes the material having the multiple quantum well structure, the active layer 330 may have a structure in which a plurality of quantum layers and a plurality of well layers are alternately laminated. The active layer 330 may emit light by combination of an electron-hole pair according to an electrical signal applied through the first semiconductor layer 310 and the second semiconductor layer 320. As an example, when the active layer 330 emits the light in the blue wavelength band, the active layer 330 may include a material such as AlGaN and/or AlGaInN. In one or more embodiments, when the active layer 330 has a multiple quantum well structure in which quantum layers and well layers are alternately laminated, the quantum layer may include AlGaN and/or AlGaInN, and the well layer may include GaN and/or AlInN. In one or more embodiments, the active layer 330 may include AlGaInN as the quantum layer and AlInN as the well layer, and as described above, the active layer 330 may emit blue light whose central wavelength band is in the range of about 450 nm to about 495 nm.

However, the present disclosure is not limited thereto. The active layer 330 may have a structure in which semiconductor materials having large band gap energy and semiconductor materials having small band gap energy are alternately laminated, and may include other group 3 to group 5 (III-V) semiconductor materials according to the wavelength band of the emitted light. The light emitted by the active layer 330 is not limited to the light in the blue wavelength band, and in some cases, the active layer 330 may emit light in the wavelength band of red or green. Although the length of the active layer 330 may be in the range of about 0.05 μm to about 0.10 μm, the present disclosure is not limited thereto.

In one or more embodiments, the light emitted by the active layer 330 may be emitted not only to the outer surface of the light emitting element 300 in the lengthwise direction, but also to both side surfaces. The directionality of the light emitted by the active layer 330 is not limited to one direction.

The electrode layer 370 may be an ohmic contact electrode. However, the present disclosure is not limited thereto, and the electrode layer 370 may be a Schottky contact electrode. The light emitting element 300 may include at least one electrode layer 370. Although it is illustrated in FIG. 7 that the light emitting element 300 includes one electrode layer 370, the present disclosure is not limited thereto. In some embodiments, the light emitting element 300 may include a larger number of electrode layers 370 or the electrode layers 370 may be omitted. The following description of the light emitting element 300 may be equally applied even when the number of electrode layers 370 is changed or other structures are further included.

When the light emitting element 300 is electrically connected (e.g., electrically coupled) to electrodes RMTL2 and RMTL3 and/or contact electrodes PXL1 and PXL2, the electrode layer 370 may reduce resistance between the light emitting element 300 and the electrode and/or contact electrode. The electrode layer 370 may include a conductive metal. For example, the electrode layer 370 may include at least one selected from aluminum (Al), titanium (Ti), indium (In), gold (Au), silver (Ag), indium tin oxide (ITO), indium zinc oxide (IZO), and indium tin zinc oxide (ITZO). Further, the electrode layer 370 may include a semiconductor material doped with an n-type or p-type impurity. The electrode layer 370 may include the same material or different materials, and the present disclosure is not limited thereto.

The insulating film 380 may surround the outer surfaces of the plurality of semiconductor layers and the electrode layers described above. In one or more embodiments, the insulating film 380 may surround at least the outer surface of the active layer 330 and may extend in one direction in which the light emitting element 300 extends. The insulating film 380 may function to protect the above members. As an example, the insulating film 380 may be formed to surround the side surfaces of the members and may be formed so that both ends of the light emitting element 300 in a lengthwise direction are exposed.

Although it is illustrated in the drawing that the insulating film 380 is formed to extend in the lengthwise direction of the light emitting element 300 and to cover the first semiconductor layer 310 to the electrode layer 370, the present disclosure is not limited thereto. The insulating film 380 may cover only a partial outer surface of the semiconductor layers in addition to the active layer 330, or cover only a partial outer surface of the electrode layer 370, and thus the outer surface of the electrode layer 370 may be partially exposed. Further, the insulating film 380 may be formed such that the upper surface in a cross section in a region adjacent to at least one end of the light emitting element 300 is round.

Although the thickness of the insulating film 380 may be in the range of about 10 nm to about 1.0 μm, the present disclosure is not limited thereto. In one or more embodiments, the thickness of the insulating film 380 may be about 40 nm.

The insulating film 380 may include materials having insulating properties, for example, silicon oxide (SiOx), silicon nitride (SiNx), silicon oxynitride (SiOxNy), aluminum nitride (AlN), aluminum oxide ($Al_2O_3$), and/or the like. Accordingly, it may be possible to prevent or reduce the risk of an electrical short circuit that may otherwise occur when the active layer 330 is in direct contact with an electrode through which an electrical signal is transmitted to the light emitting element 300. Further, because the insulating film 380 protects the outer surface of the light emitting element 300 in addition to the active layer 330, a decrease in luminous efficiency can be prevented or reduced.

Further, in some embodiments, the outer surface of the insulating film 380 may be surface-treated. When the display device 10 is manufactured, the light emitting elements 300 may be sprayed and arranged onto the electrode in a state of being dispersed in a set or predetermined ink. Here, in order for the light emitting elements 300 to remain in a dispersed state without being aggregated with other adjacent light emitting elements 300 in the ink, the surface of the insulating film 380 may be subjected to hydrophobic or hydrophilic treatment.

The light emitting element 300 may have a length h of about 1 µm to about 10 µm or about 2 µm to about 6 µm, and for example about 3 µm to about 5 µm. Further, a diameter of the light emitting element 300 may be in the range of about 300 nm to about 700 nm, and an aspect ratio of the light emitting element 300 may be in the range of 1.2 to 100. However, the present disclosure is not limited thereto. The plurality of light emitting elements 300 included in the display device 10 may have different diameters according to a composition difference of the active layer 330. For example, the diameter of the light emitting element 300 may be about 500 nm.

As described above, in the display device 10 according to one or more embodiments, the inner bank layer IBL and the outer bank 450 are formed to be coplanar through the same process, and thus the number of masks can be reduced.

Hereinafter, a process of manufacturing the display device 10 will be described with reference to other drawings. Hereinafter, while describing the order of the process of manufacturing the display device 10, the description of a method of forming each member will not be provided.

FIGS. 8 to 14 are cross-sectional views of process operations of a method of manufacturing a display device according to one or more embodiments.

Figure 8:
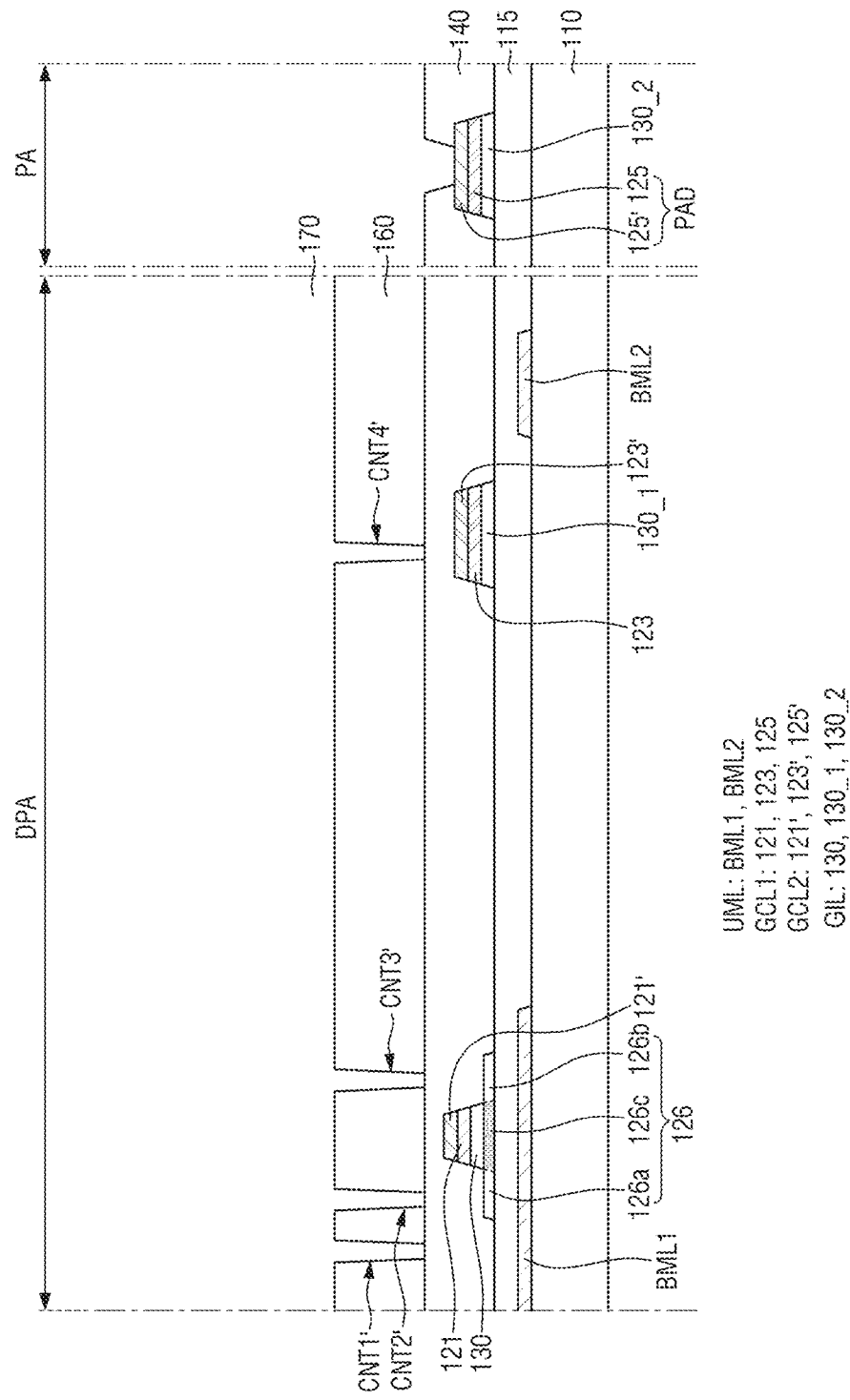
FIGS. 8 to 14 are cross-sectional views of process operations of a method of manufacturing a display device according to the one or more embodiments.

Referring to FIGS. 6 and 8, the via layer 160 is formed on the interlayer insulating layer 140. The formation of the via layer 160 includes forming a via material layer on the interlayer insulating layer 140 and forming a first through-hole CNT1' to a fourth through-hole CNT4'. Each of the through-holes CNT1' to CNT4' extends from the upper surface of the via layer 160 to the lower surface of the via layer 160 (the upper surface of the interlayer insulating layer 140).

Figure 9:
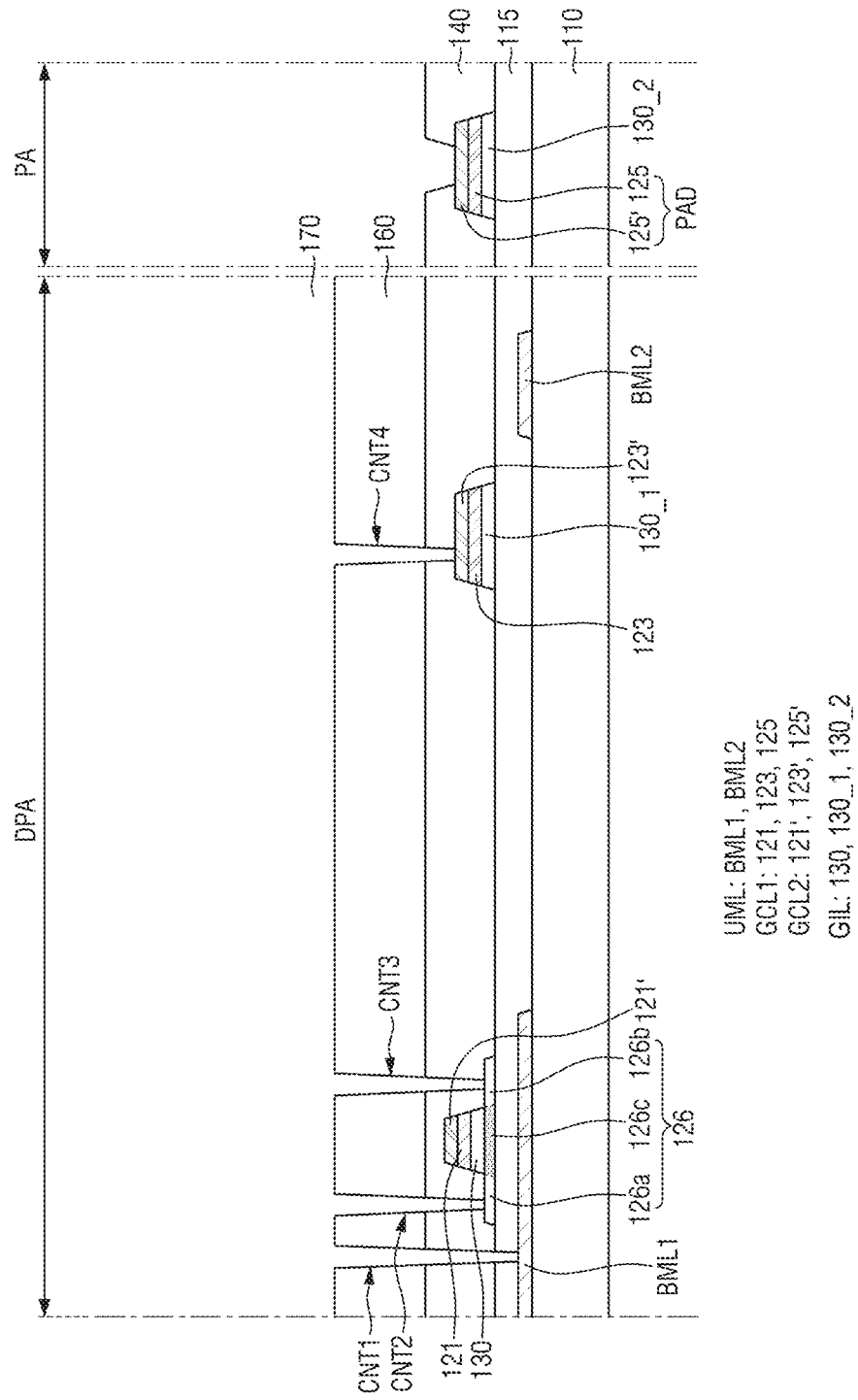

Next, referring to FIGS. 6, 8, and 9, the first to fourth contact holes CNT1 to CNT4 are formed. As illustrated in FIG. 8, after the first to fourth through-holes CNT1' to CNT4' are formed, the first contact hole CNT1 is formed by further passing through the interlayer insulating layer 140 and the buffer layer 115 from the first through-hole CNT1', the second contact hole CNT2 is formed by further passing through the interlayer insulating layer 140 from the second through-hole CNT2', the third contact hole CNT3 is formed by further passing through the interlayer insulating layer 140 from the third through-hole CNT3', and the fourth contact hole CNT4 is formed by further passing through the interlayer insulating layer 140 from the fourth through-hole CNT4'.

Figure 10:
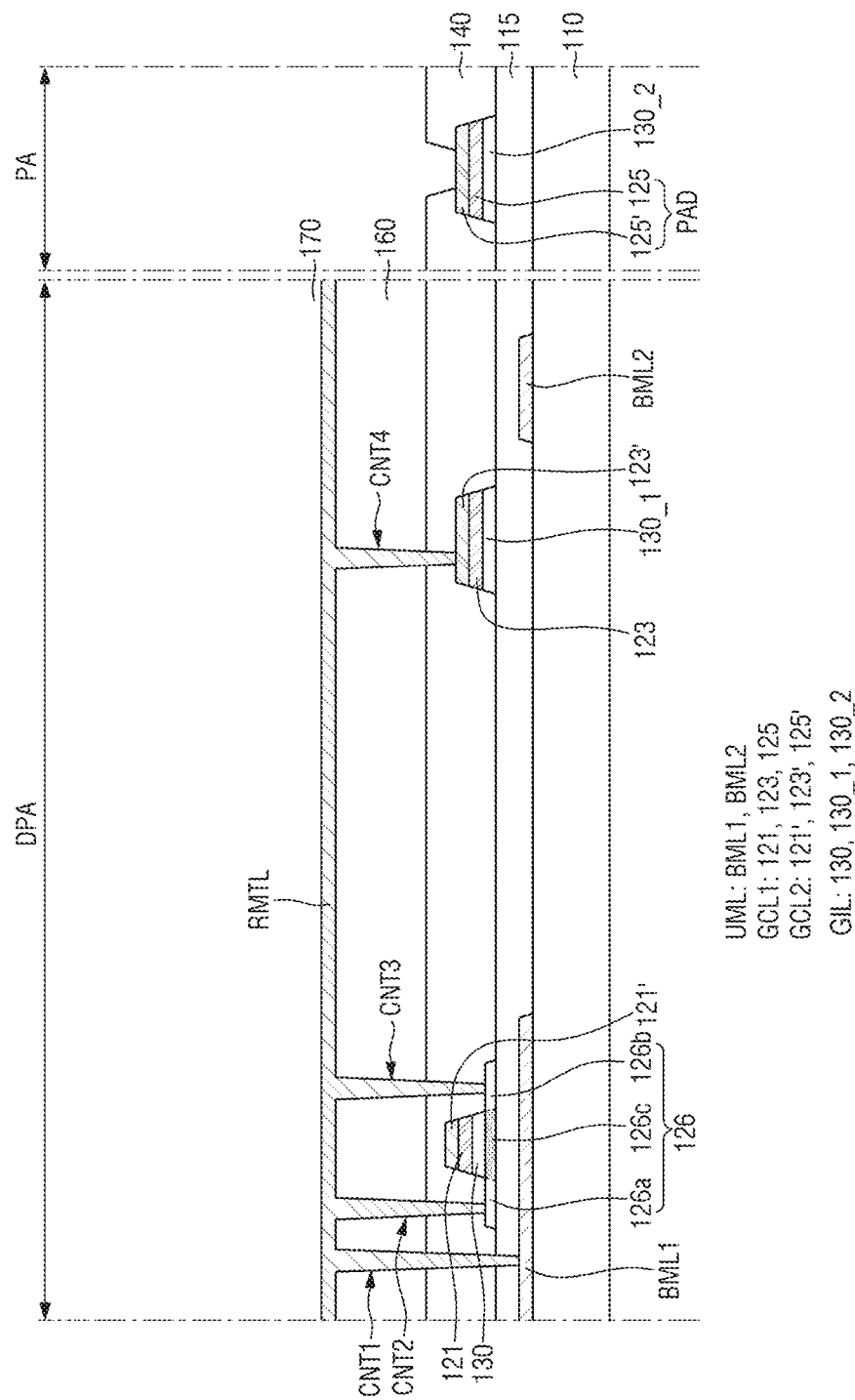

Next, referring to FIGS. 6 and 10, the electrode layer RMTL is formed on the via layer 160. The electrode layer RML fills the first to fourth contact holes CNT1 to CNT4, which are electrically connected (e.g., electrically coupled) to the first lower metal pattern BML1, the first doped area 126a, the second doped area 126b, and the sub signal application electrode 123', respectively.

Figure 11:
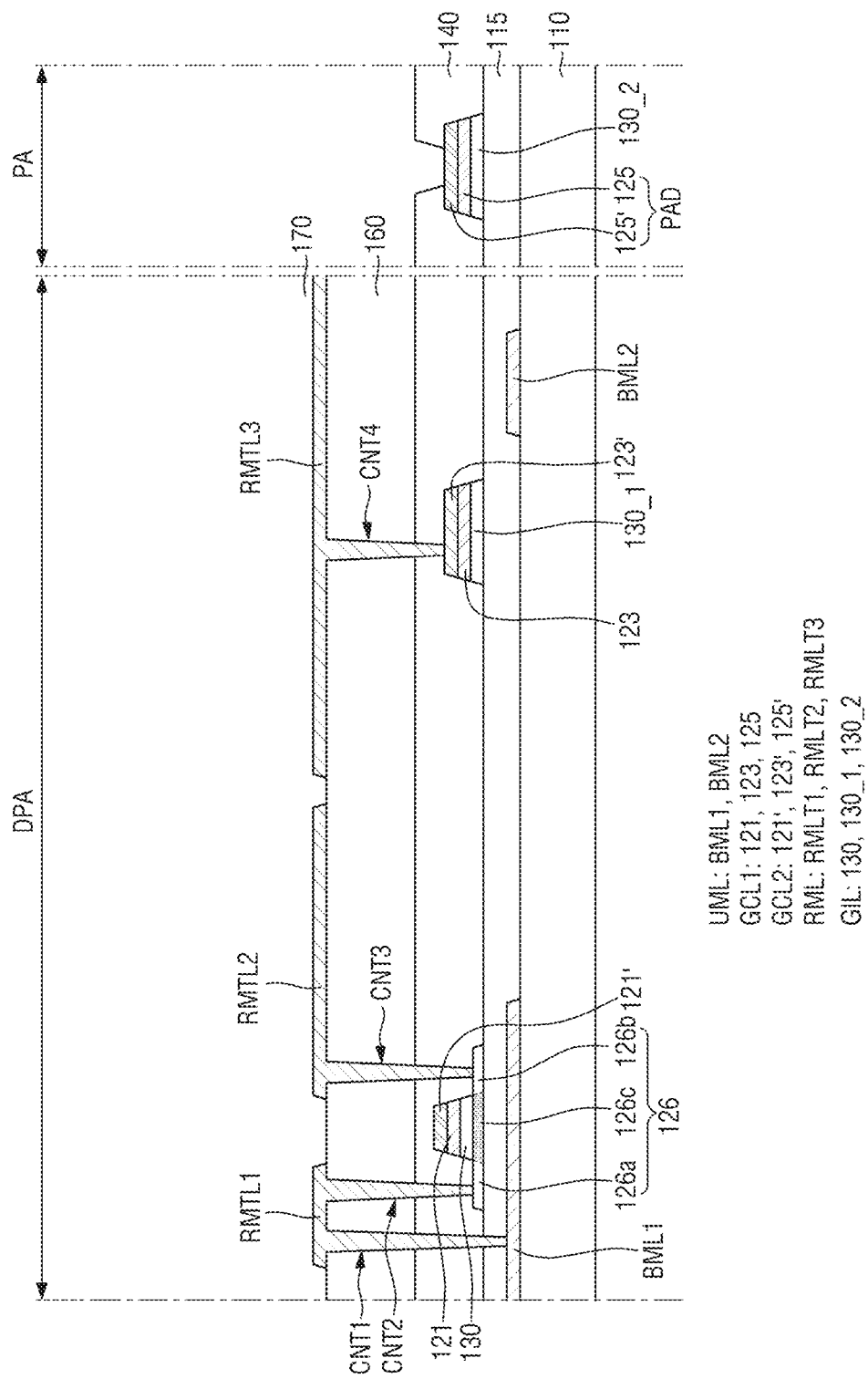

Next, referring to FIGS. 6 and 11, the first to fourth electrodes RMTL1 to RMTL4 are formed from the electrode layer RML. The electrodes RMTL1 to RMTL4 are physically spaced apart from each other.

Figure 12:
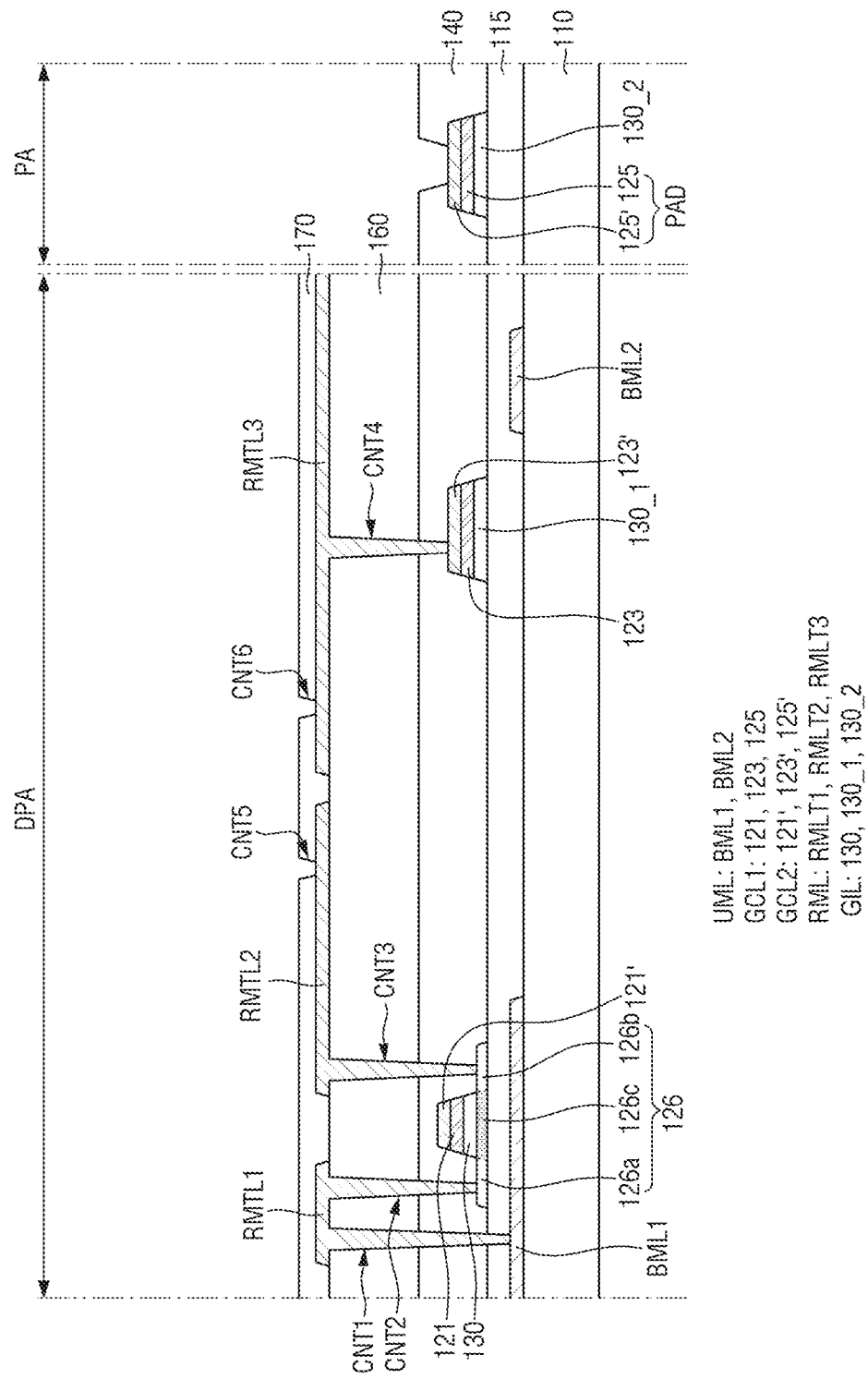

Next, referring to FIGS. 6 and 12, the protective layer 170 is formed by forming a protective material layer on the electrodes RMTL1 to RMTL4 and forming the fifth and sixth contact holes CNT5 and CNT6 in the protective material layer.

The fifth contact hole CNT5 overlaps the second electrode RMTL2 in the thickness direction and the sixth contact hole CNT6 overlaps the third electrode RMTL3 in the thickness direction.

Figure 13:
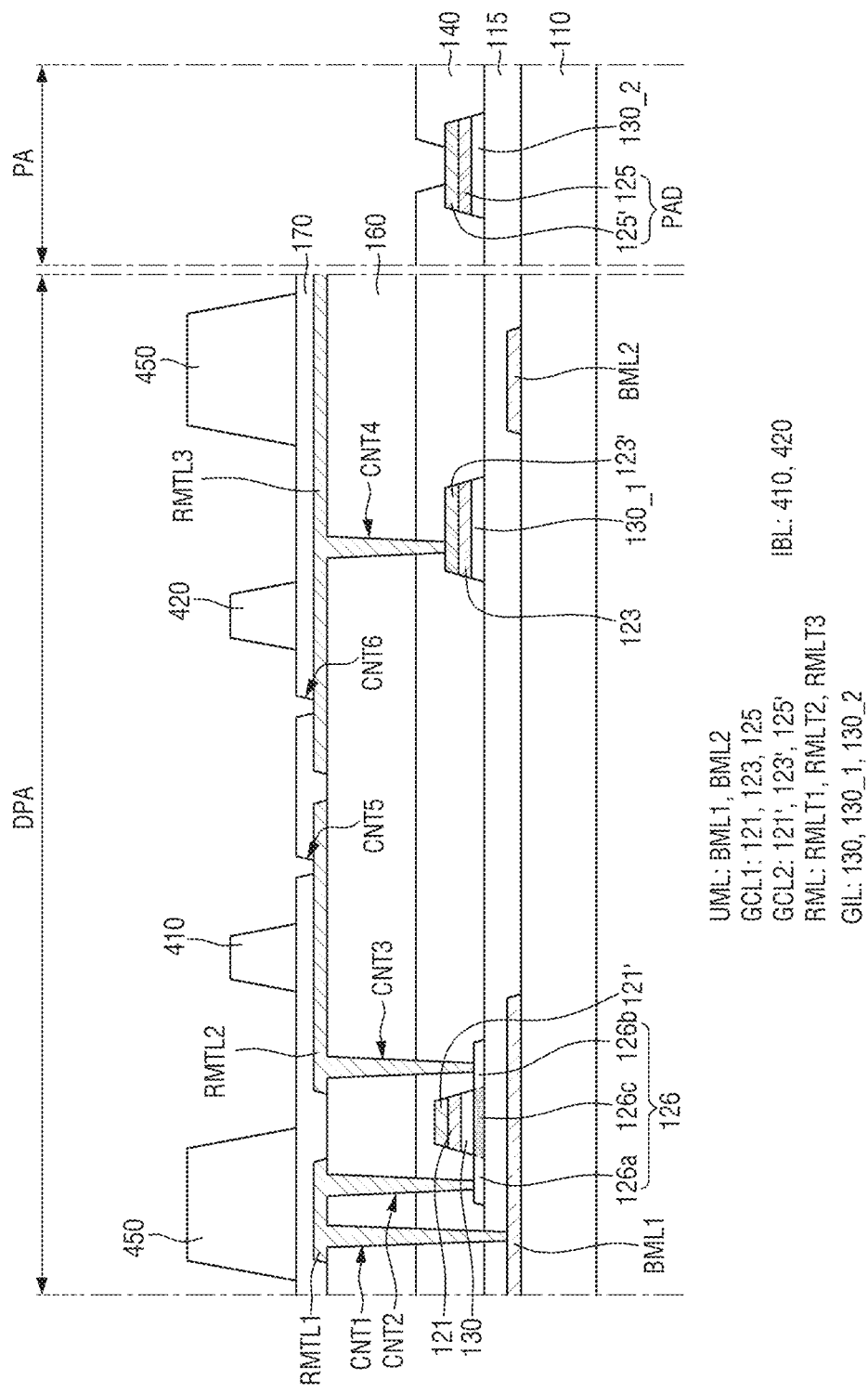

Next, referring to FIGS. 6 and 13, the inner bank layer IBL including the first inner bank 410 and the second inner bank 420 and the outer bank 450 are formed on the protective layer 170. The inner bank layer IBL and the outer bank 450 may be simultaneously (e.g., concurrently) formed through the same process. The inner bank layer IBL and the outer bank 450 may be formed through a mask process. The inner bank layer IBL and the outer bank 450 may be formed through a half tone mask, and thus the inner bank layer IBL and the outer bank 450 may have different heights. In an exposure process of the mask process, the outer bank 450 is not exposed, an area between the inner bank layer IBL and the outer bank 450 is fully exposed, and the inner bank layer IBL is half-exposed.

Figure 14:
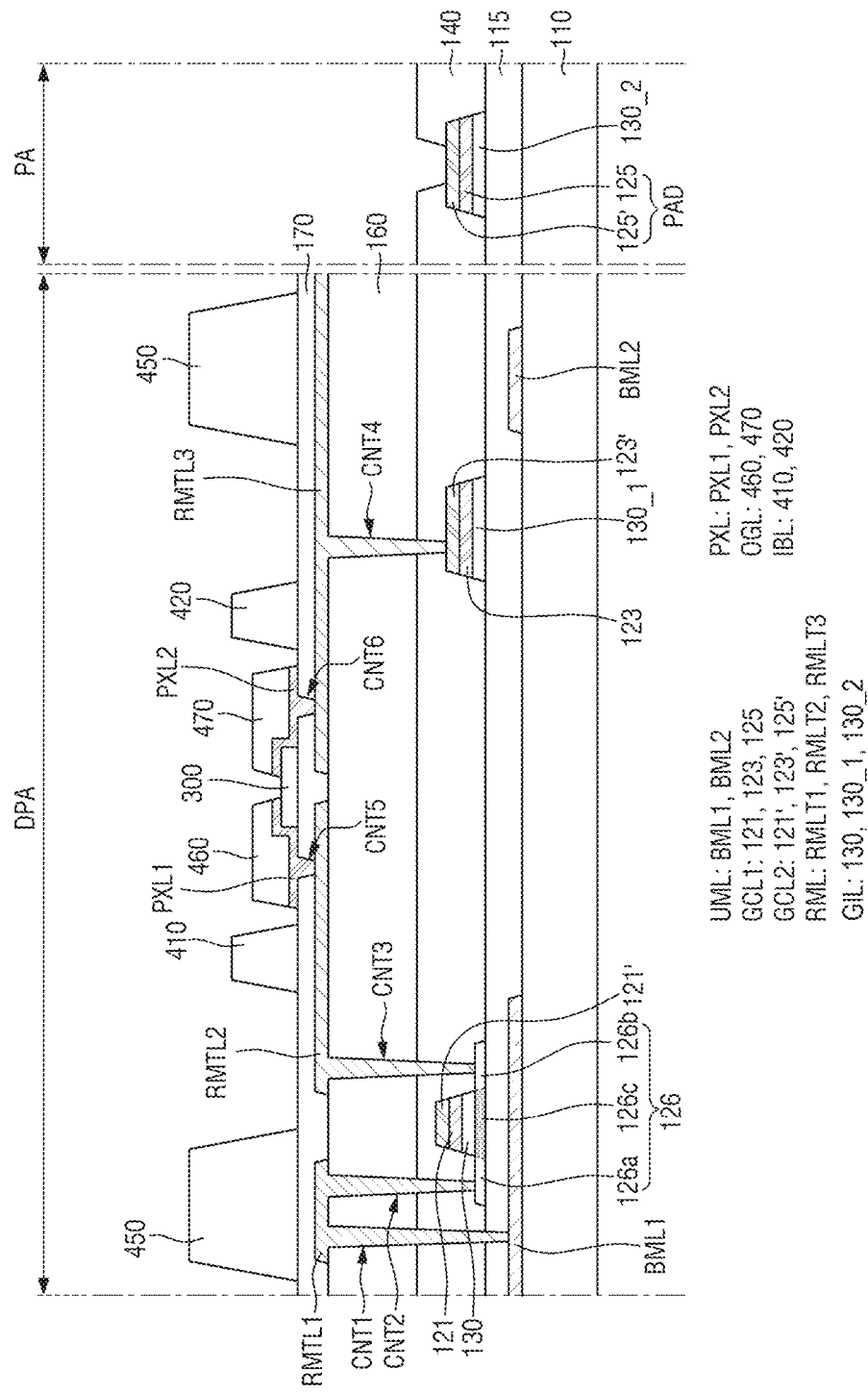

Next, referring to FIGS. 6 and 14, the light emitting elements 300 are formed between the first and second inner banks 410 and 420 on the protective layer 170. The light emitting elements 300 are formed by being arranged through the alignment signal applied from the second electrode RMTL2 and the third electrode RMTL3 described above in FIG. 6.

Next, the contact electrode layer PXL is formed on the protective layer 170 and the light emitting element 300. The contact electrode layer PXL may fill the fifth and sixth contact holes CNT5 and CNT6 which are electrically connected (e.g., electrically coupled) to the second and third electrodes RMTL2 and RMTL3, respectively.

After the contact electrode layer PXL is formed, the organic layer OGL is formed on the contact electrode layer PXL. The organic layer OGL may include a first organic pattern 460 and a second organic pattern 470. The first organic pattern 460 and the second organic pattern 470 may be located to be spaced apart from each other with a set or predetermined separation space therebetween.

Next, the first contact electrode PXL1 and the second contact electrode PXL2 are formed using the first and second organic patterns 460 and 470. The first contact electrode PXL1 and the second contact electrode PXL2 are spaced apart from each other with a set or predetermined separation space therebetween, the separation space between the first and second contact electrodes PXL1 and PXL2 overlaps the separation space between the first and second organic patterns 460 and 470 in the thickness direction.

Figure 15:
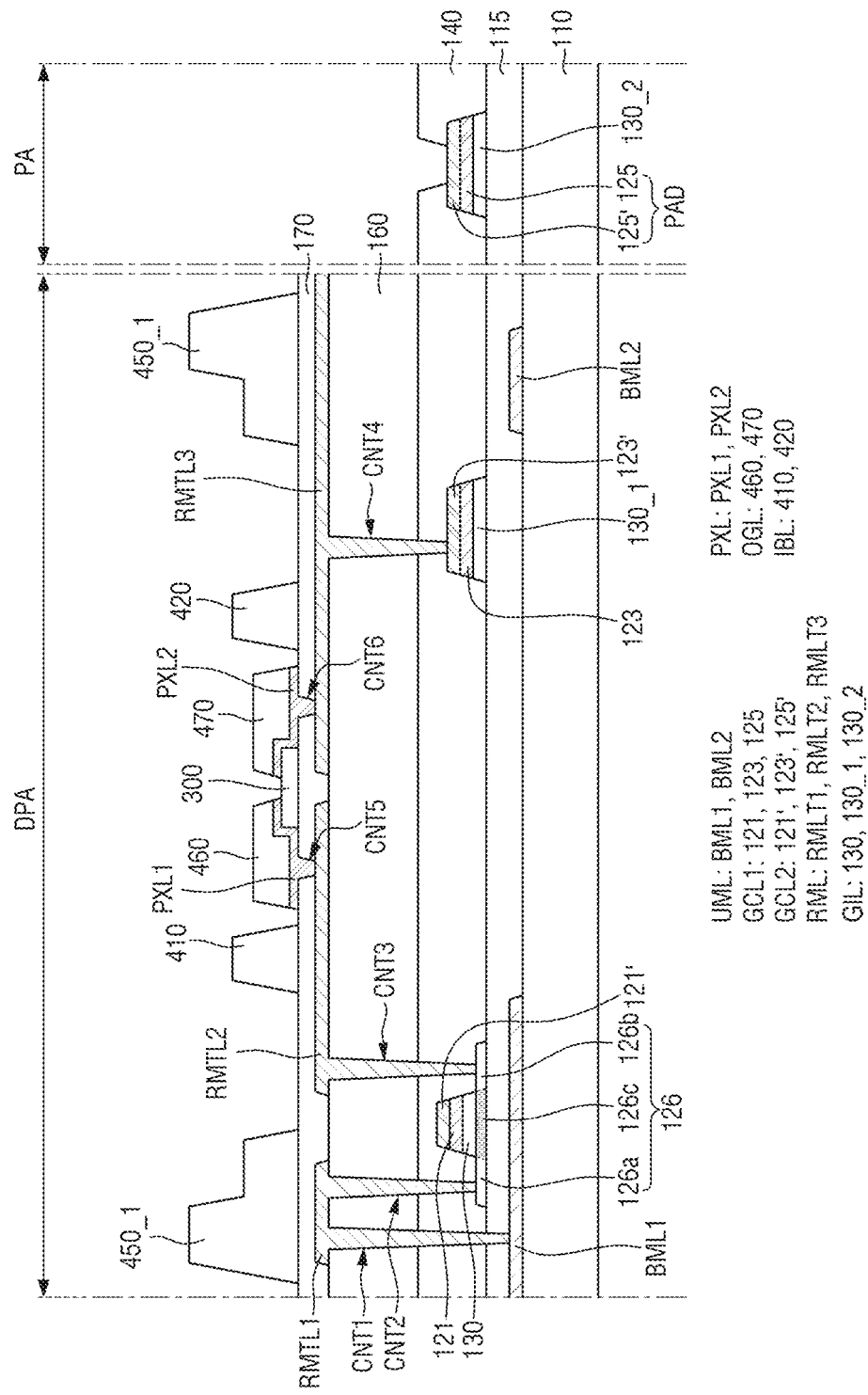
FIG. 15 is a cross-sectional view illustrating a part of a display device according to one or more other embodiments.

FIG. 15 is a cross-sectional view illustrating a part of a display device according to one or more other embodiments.

Referring to FIG. 15, the display device according to the present embodiments differs from the display device of FIG. 6 in that the outer bank and the inner bank layer IBL of FIG. 6 are integrally formed. For example, the outer bank 450_1 of FIG. 15 may not be exposed in the exposure process of the mask process, the inner bank layer IBL may be half-exposed, and an area between the inner bank layer IBL and the outer bank 450_1 may be half-exposed, which is like the inner bank layer IBL.

Figure 16:
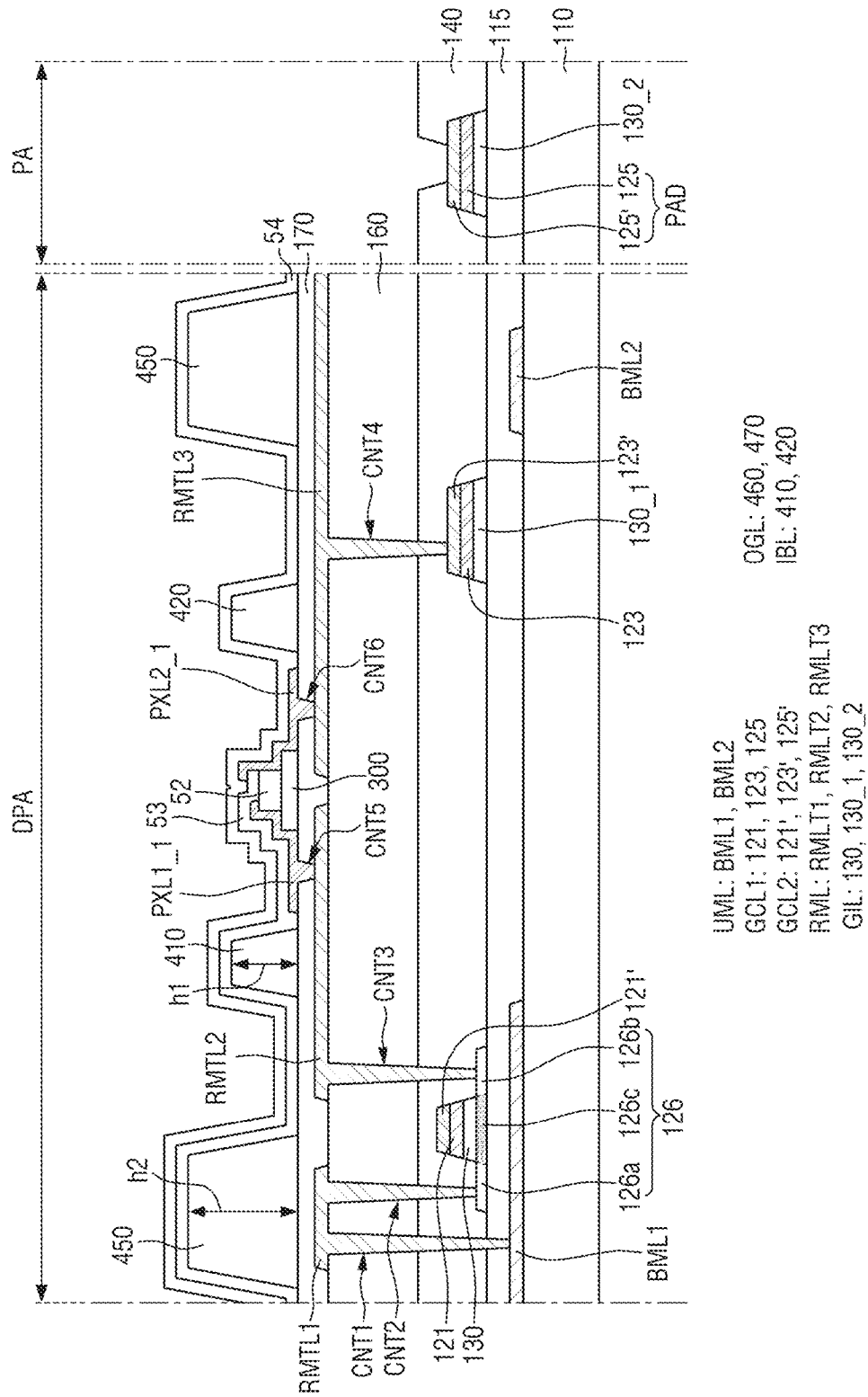
FIG. 16 is a cross-sectional view illustrating a part of a display device according to one or more other embodiments.

FIG. 16 is a cross-sectional view illustrating a part of the display device according to one or more other embodiments.

Referring to FIG. 16, the display device according to the present embodiments differs from the display device of FIG. 6 in that a first contact electrode PXL1_1 and a second contact electrode PXL2_1 are located to not be coplanar.

In more detail, the display device may further include a first insulating layer 52, a second insulating layer 53, and a third insulating layer 54. The first insulating layer 52 is on the light emitting element 300. The first insulating layer 52 may be directly provided at a central portion of the upper surface of the light emitting element 300. The first contact electrode PXL1_1 may be in contact with the side surface and the upper surface on one end side of the light emitting element 300 and may be in contact with the side surface and the upper surface on one end side of the first insulating layer 52. The second insulating layer 53 may be on the outer bank 450, the first inner bank 410, and the first contact electrode PXL1_1. Although the side surface on the other end side of the second insulating layer 53 may be aligned with the side surface on the other end side of the first insulating layer 52, the present disclosure is not limited thereto. The second contact electrode PXL2_1 may be in contact with the side surface and the upper surface on the other end side of the light emitting element 300 and may be in contact with the side surface and the upper surface on the other end side of the first insulating layer 52. The third insulating layer 54 may be on the second insulating layer 53, the second contact electrode PXL2_1, the second inner bank 420, and the outer bank 450.

Figure 17:
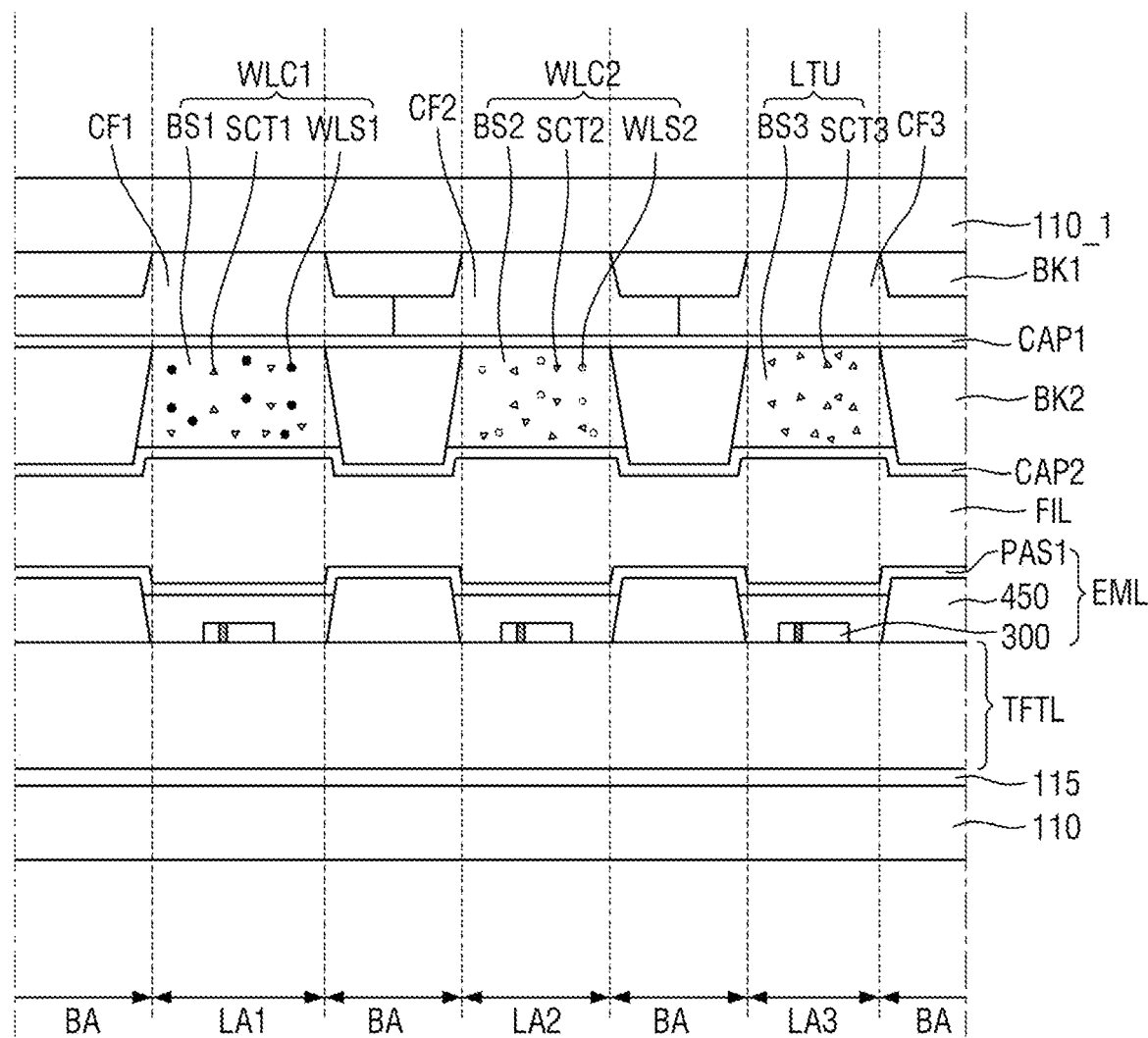
FIG. 17 is a cross-sectional view of the display device according to one or more other embodiments.

FIG. 17 is a cross-sectional view of the display device according to one or more other embodiments.

Referring to FIG. 17, the display device according to the present embodiments differs from the display device of FIG. 3 in that a second substrate 110_1 opposite to the first substrate 110 is further provided.

In more detail, the second substrate 110_1 is opposite to the first substrate 110. The second substrate 110_1 may include the same material as the material(s) exemplified in the first substrate 110.

The first bank BK1 is on one surface of the second substrate 110_1 facing the first substrate 110. The first bank BK1 may be in the light blocking area BA.

The first to third color filters CF1, CF2, and CF3 may be arranged on the first bank BK1 and one surface of the second substrate 110_1 facing the first substrate 110. The first color filter CF1 may be in the first light emitting area LA1, the second color filter CF2 may be in the second light emitting area LA2, and the third color filter CF3 may be in the third light emitting area LA3.

The first capping layer CAP1 may be on the first to third color filters CF1, CF2, and CF3. The second bank BK2 may be on the first capping layer CAP1. The second bank BK2 may be in the light blocking area BA. The first and second wavelength conversion units WLC1 and WLC2 and the light transmission unit LTU may be arranged between adjacent second banks BK2. The second capping layer CAP2 may be on the first and second wavelength conversion units WLC1 and WLC2, the light transmission unit LTU, and the second bank BK2.

A filling layer FIL may be between the first protective layer PAS1 and the second capping layer CAP2.

Figure 18:
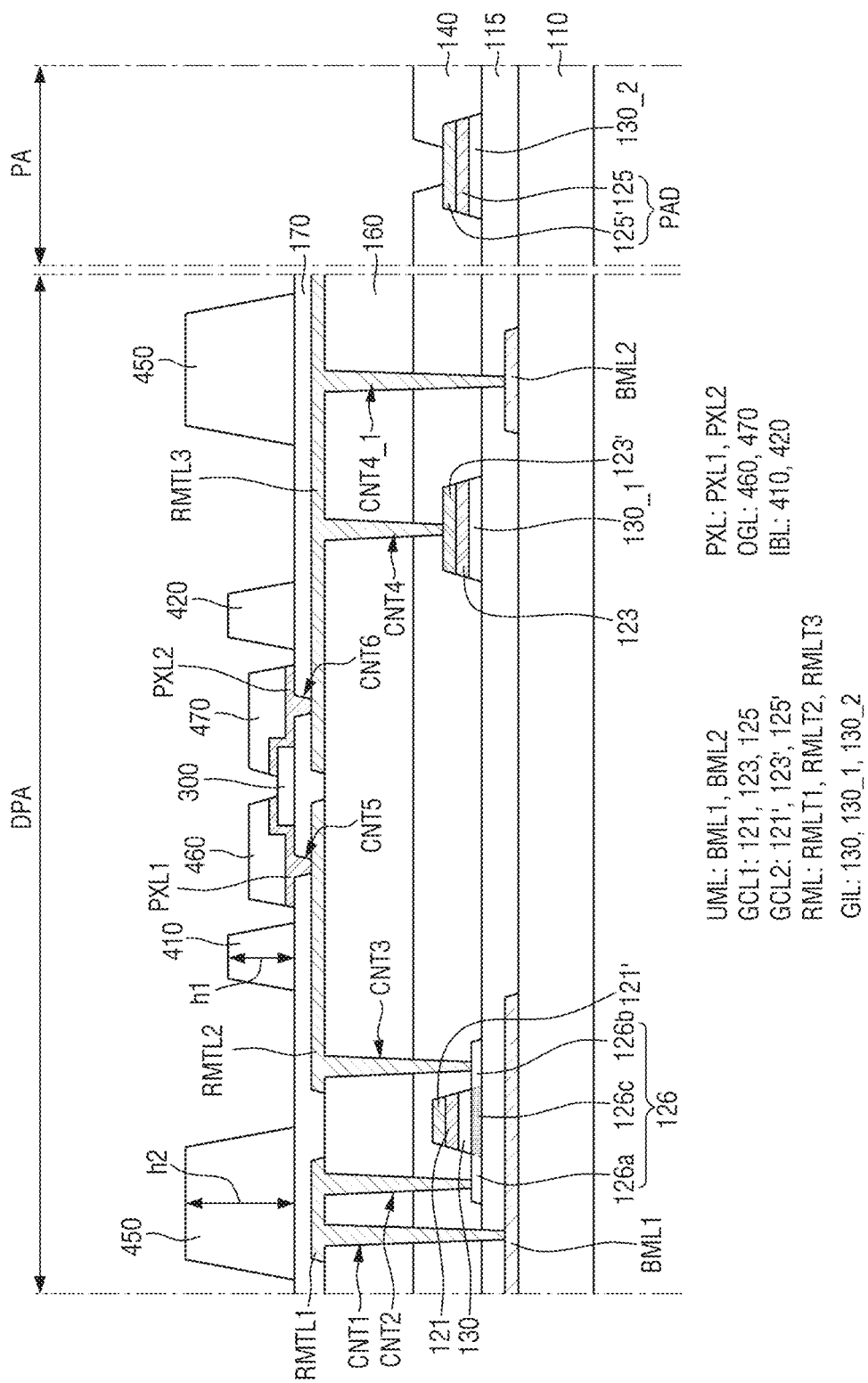
FIG. 18 is a cross-sectional view illustrating a part of a display device according to one or more other embodiments.

FIG. 18 is a cross-sectional view illustrating a part of a display device according to one or more other embodiments.

Referring to FIG. 18, the display device according to the present embodiments differs from the display device of FIG. 6 in that the third electrode RMTL3 may be further connected (e.g., physically coupled) to the second lower metal pattern BML2 through a fourth contact hole CNT4_1.

In more detail, the fourth contact hole CNT4_1 may pass through the via layer 160, the interlayer insulating layer 140, and the buffer layer 115 in the thickness direction. The second power voltage may be applied from the second lower metal pattern BML2 and may be provided to the third electrode RMTL3.

In some embodiments, unlike that illustrated in FIG. 18, the fourth contact hole CNT4 may be omitted and the third electrode RMTL3 may receive the second power voltage only through the fourth contact hole CNT4_1.

In one or more embodiments illustrated in FIG. 18, the second power voltage is applied through the second lower metal pattern BML2 and the second lower metal pattern BML2 and the sub signal application electrode 123' are connected (e.g., electrically coupled) using the third electrode RMTL3 as a bridge electrode.

In other one or more embodiments, the second power voltage is applied through the sub signal application electrode 123' and the sub signal application electrode 123' and the second lower metal pattern BML2 are connected (e.g., electrically coupled) using the third electrode RMTL3 as a bridge electrode.

The display device according to one or more embodiments is manufactured with a small number of masks, and thus simplification of a process during the manufacturing can be achieved.

In the method of manufacturing a display device according to one or more embodiments, a display device is manufactured with a small number of masks, and thus simplification of a process can be achieved.

Effects according to one or more embodiments are not limited by the contents exemplified above, and more various effects are included in the present disclosure.

Although embodiments of the disclosure have been disclosed for illustrative purposes, those skilled in the art will appreciate that various modifications, additions and substitutions are possible, without departing from the scope and spirit of the disclosure as disclosed in the accompanying claims and their equivalents.

What is claimed is:

1. A display device comprising:
a first substrate comprising a display area and a non-display area around the display area;
an active material layer on the first substrate, the active material layer comprising a channel area, a first doped area on one side of the channel area, and a second doped area on another side of the channel area;
a gate insulating layer on the active material layer;
a first conductive layer on the gate insulating layer, the first conductive layer comprising a signal application electrode and a gate electrode to overlap the channel area;
an interlayer insulating layer on the first conductive layer;
a via layer on the interlayer insulating layer;
a second conductive layer on the via layer, the second conductive layer comprising a first electrode electrically connected to the first doped area through a first contact hole passing through the via layer and the interlayer insulating layer, a second electrode electrically connected to the second doped area through a second contact hole passing through the via layer and the interlayer insulating layer, and a third electrode electrically connected to the signal application electrode through a third contact hole passing through the via layer and the interlayer insulating layer;
a first insulating layer on the second conductive layer;
a light emitting element on the first insulating layer of the display area; and
a third conductive layer on the light emitting element, the third conductive layer being connected to the light emitting element and comprising a first contact electrode electrically connected to the second electrode through a first contact electrode hole passing through the first insulating layer, and a second contact electrode electrically connected to the third electrode through a second contact electrode hole passing through the first insulating layer, wherein the non-display area further comprises a pad area, the first conductive layer further comprises a first pad part in the pad area and a second pad part between the first conductive layer and the interlayer insulating layer, the second pad part being on an entire upper surface of the first pad part, the first pad part comprises an opaque conductive material, and the second pad part comprises a transparent conductive material.

2. The display device of claim 1, wherein the gate insulating layer comprises:
   a first gate insulating pattern overlapping the gate electrode in a thickness direction of the display device; and
   a second gate insulating pattern separated from the first gate insulating pattern and overlapping the signal application electrode in the thickness direction.

3. The display device of claim 2, wherein a size of the first gate insulating pattern is the same as a size of the gate electrode, and
   a size of the signal application electrode is the same as a size of the second gate insulating pattern.

4. The display device of claim 2, wherein the first contact electrode and the second contact electrode are in direct contact with an upper surface of the light emitting element.

5. The display device of claim 4, wherein the first contact electrode is in contact with one end of the light emitting element and a portion of the upper surface of the light emitting element, and
   the second contact electrode is separated from the first contact electrode and is in contact with another end of the light emitting element and another portion of the upper surface of the light emitting element.

6. The display device of claim 5, wherein a separation area between the first contact electrode and the second contact electrode exposes the upper surface of the light emitting element.

7. The display device of claim 6, further comprising a first organic pattern overlapping the first contact electrode and a second organic pattern overlapping the second contact electrode,
   wherein the first organic pattern and the second organic pattern are separated from each other.

8. The display device of claim 7, wherein an inner surface of the first organic pattern is aligned with an inner surface of the first contact electrode in the thickness direction, and
   wherein an inner surface of the second organic pattern is aligned with an inner surface of the second contact electrode in the thickness direction.

9. The display device of claim 7, further comprising an inner bank layer on the first insulating layer,
   wherein the inner bank layer comprises a first inner bank outside the first contact electrode and a second inner bank outside the second contact electrode,
   a surface height of the first inner bank is larger than a surface height of the first organic pattern, and
   a surface height of the second inner bank is higher than a surface height of the second organic pattern.

10. The display device of claim 9, further comprising an outer bank coplanar with the inner bank layer,
    wherein the outer bank is outside the first inner bank and the second inner bank.

11. The display device of claim 10, wherein a height of the outer bank is larger than the height of the first inner bank and the height of the second inner bank.

12. The display device of claim 11, wherein the inner bank layer and the outer bank are formed through the same process, and
    wherein the inner bank layer and the outer bank are formed through a half-tone mask.

13. The display device of claim 1, wherein the interlayer insulating layer exposes a central portion of an upper surface of the second pad part.

14. The display device of claim 10, further comprising:
    a second insulating layer on the light emitting element, the inner bank layer, and the outer bank;
    a first planarization layer on the second insulating layer; and
    a wavelength conversion unit on the first planarization layer.

15. The display device of claim 14, further comprising:
    a second planarization layer on the wavelength conversion unit; and
    a color filter layer on the second planarization layer.

16. The display device of claim 10, further comprising:
    a second insulating layer on the light emitting element, the inner bank layer, and the outer bank;
    a second substrate on the second insulating layer and opposite to the first substrate;
    a color filter layer between the second substrate and the second insulating layer;
    a wavelength conversion layer between the color filter layer and the second insulating layer; and
    a filling layer between the wavelength conversion layer and the second insulating layer.

17. The display device of claim 5, further comprising:
    a first inter-element electrode insulating layer between the light emitting element and the first contact electrode; and
    a second inter-element electrode insulating layer between the first inter-element electrode insulating layer and the second contact electrode.

* * * * *